United States Patent [19]
Bald et al.

[11] Patent Number: 6,054,865
[45] Date of Patent: Apr. 25, 2000

[54] MULTIPLE FUNCTION ELECTRICAL SAFETY COMPLIANCE ANALYZER

[75] Inventors: Roger A. Bald, Round Lake Beach, Ill.; Pin-Yi Chen, Taipei, Taiwan

[73] Assignee: Associated Research, Inc., Lake Bluff, Ill.

[21] Appl. No.: 09/033,958

[22] Filed: Mar. 3, 1998

[51] Int. Cl.⁷ .................................................. G01R 31/08
[52] U.S. Cl. .......................... 324/551; 324/73.1; 324/557; 324/545; 324/546; 340/647
[58] Field of Search ..................... 324/73.1, 551, 324/510, 545, 546, 547, 557; 340/649, 650, 651, 647

[56] References Cited

U.S. PATENT DOCUMENTS

| | | | |
|---|---|---|---|
| 4,408,157 | 10/1983 | Beaubien | 324/551 |
| 5,051,732 | 9/1991 | Robitaille | 324/510 |
| 5,448,176 | 9/1995 | Mashikian | 324/551 |

*Primary Examiner*—Diep N. Do
*Assistant Examiner*—Jose M. Solis
*Attorney, Agent, or Firm*—Bacon & Thomas

[57] ABSTRACT

A safety compliance test instrument includes circuitry for performing insulation resistance and ground circuit tests such as a ground bond test, as well as high voltage AC and DC dielectric withstand or hipot tests. A micro-processor based controller provides control signals to a common power circuit, and accepts input of test parameters for all four tests through an integrated user interface including a keypad and menu display.

19 Claims, 18 Drawing Sheets

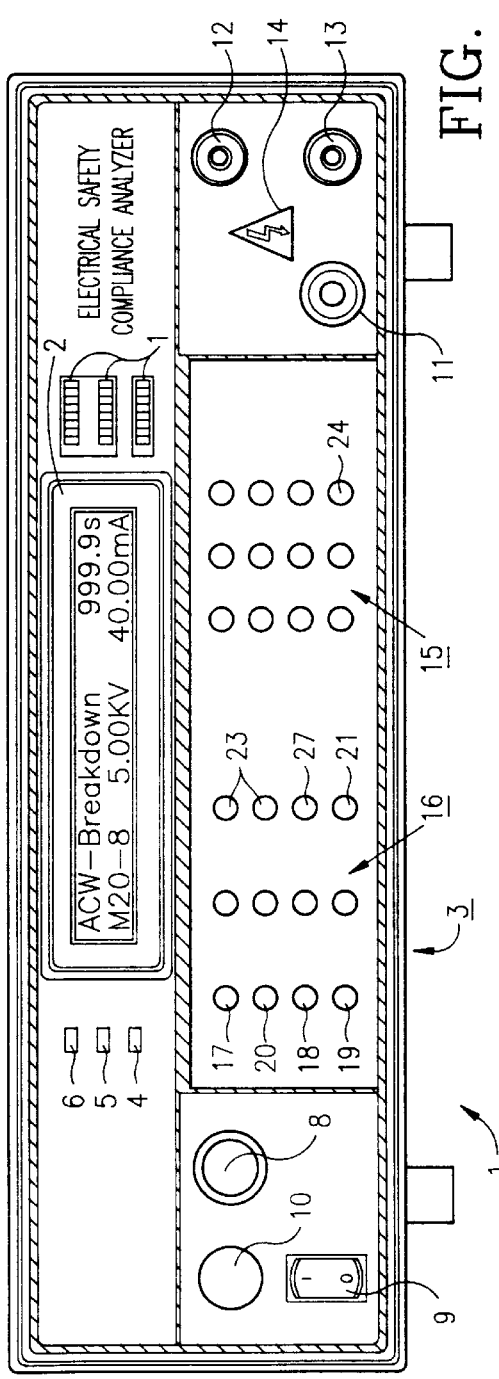
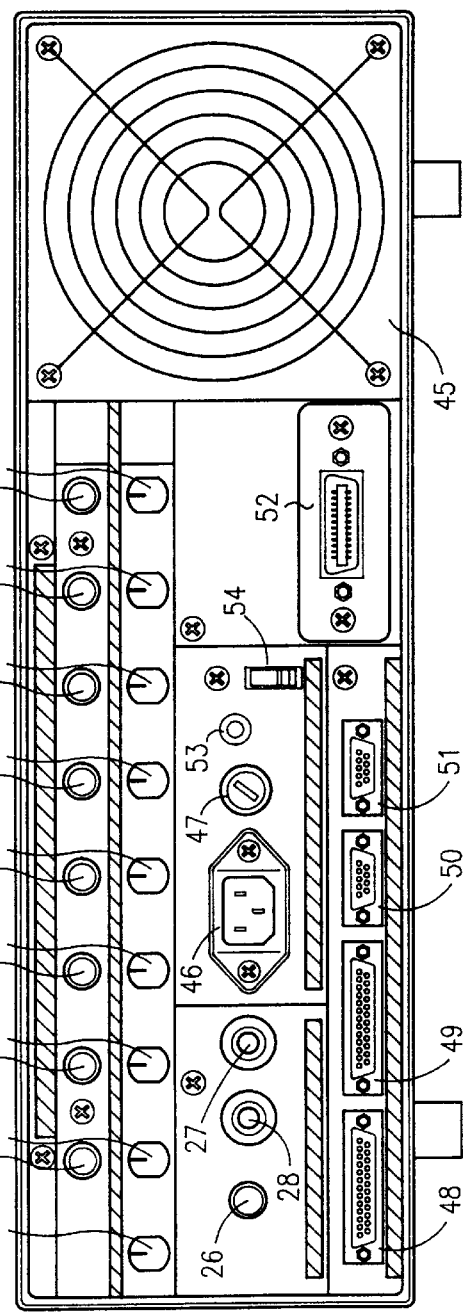
FIG. 1
FIG. 2

INPUT PROTECTION BOARD

RECTIFIER BOARD

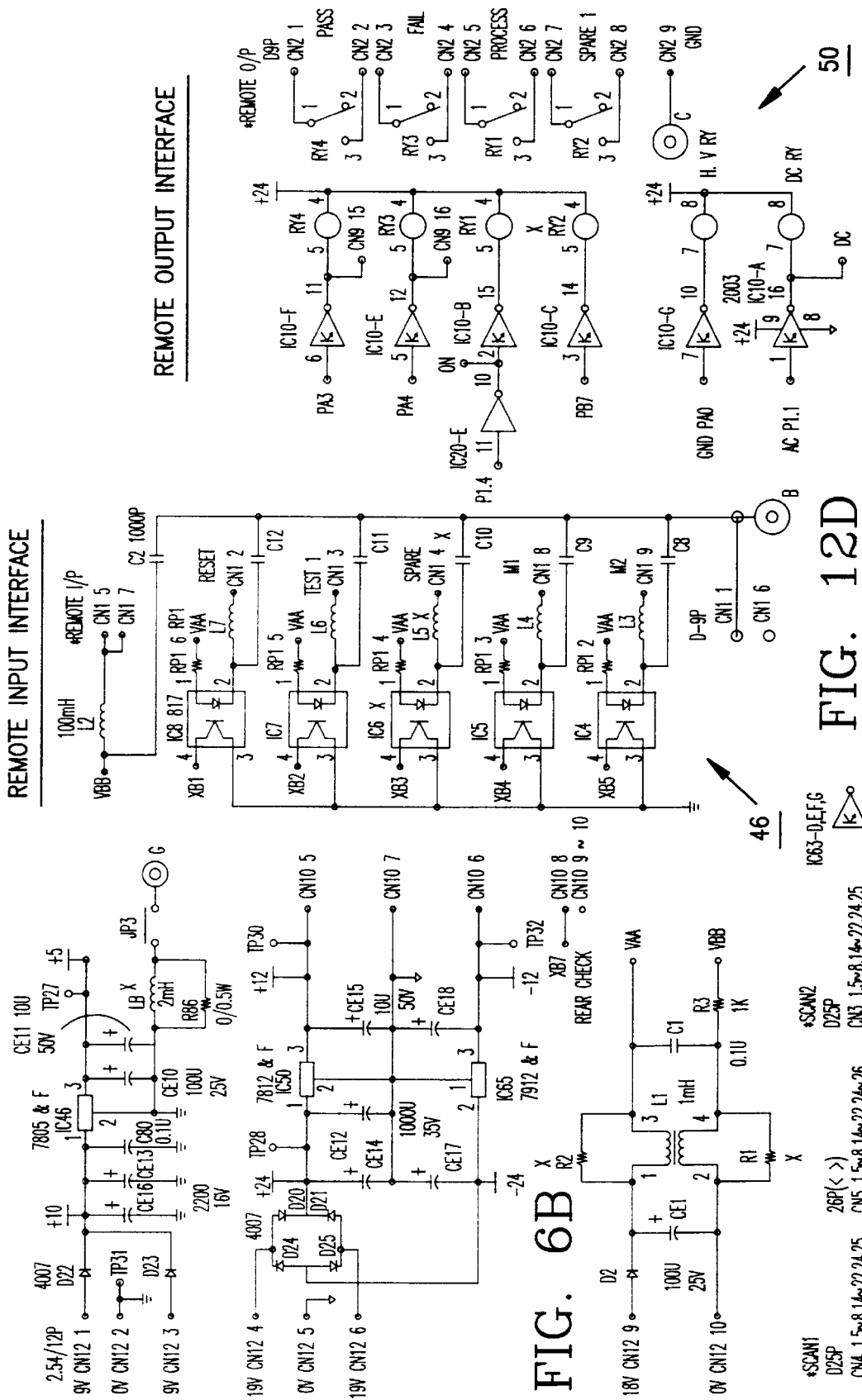

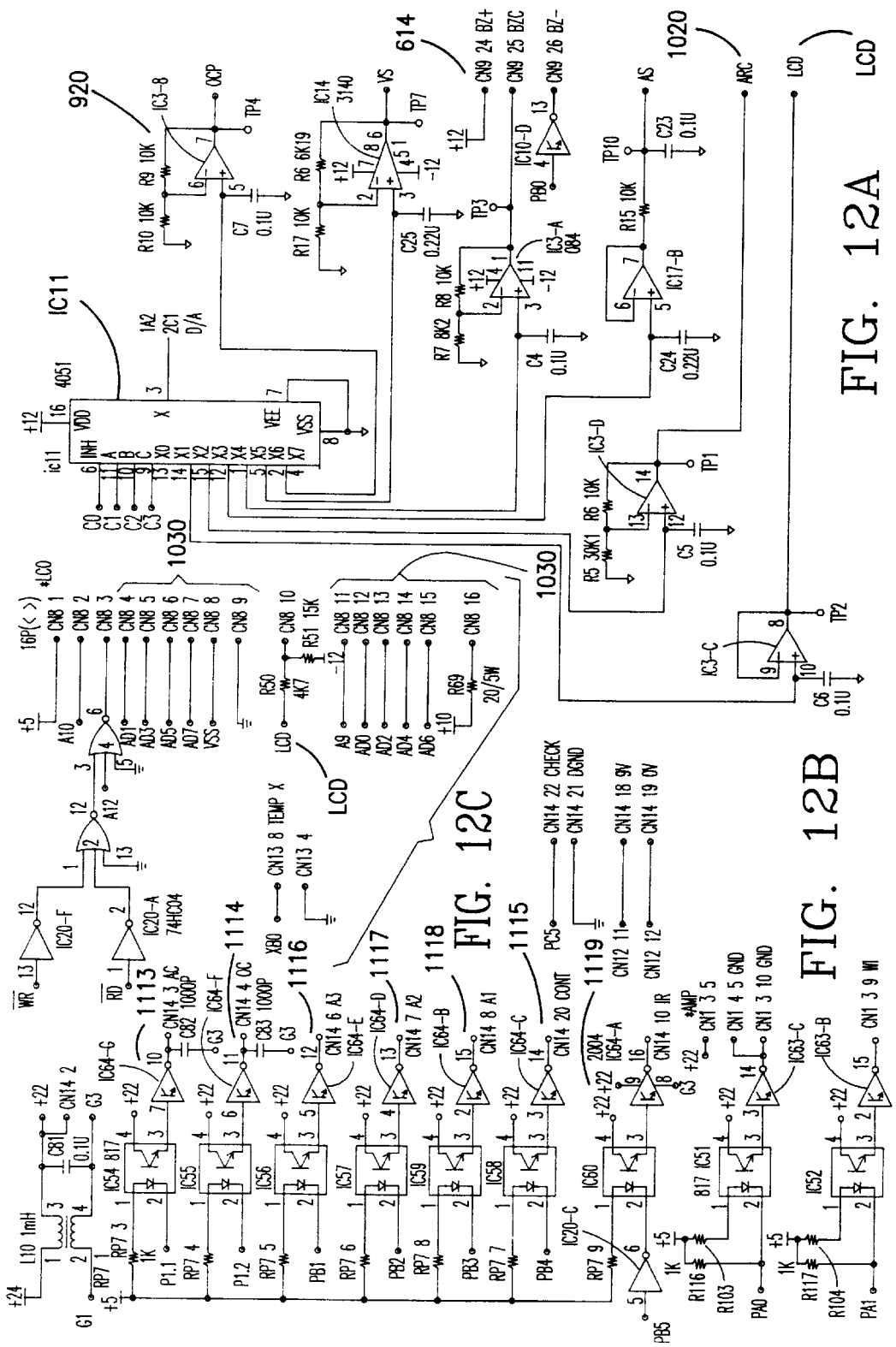

RS232 INTERFACE

MULTIPLE FUNCTION ELECTRICAL SAFETY COMPLIANCE ANALYZER

BACKGROUND OF THE INVENTION

1. Field of the Invention

The present invention relates to an electrical safety compliance analyzer, and in particular to an electrical safety compliance analyzer capable of performing multiple safety compliance tests, including AC and DC dielectric voltage withstand tests, an insulation resistance test, and a ground circuit test.

2. Description of Related Art

A. Types of Electrical Safety Compliance Tests

In a ground referenced power supply circuit such as is commonly used in the United States, leakage current due to faulty insulation or improper design will flow from the power circuit of an electrical circuit to ground via the lowest impedance path, injuring anyone in that path. To prevent such injuries, electrical insulation in the product must be free from defects, and the ground circuit must be functioning properly, i.e., the ground circuit of the electrical product must be the lowest impedance path to ground.

A number of tests are currently used to determine insulation quality in order meet safety regulations for the products tested, and prevent injuries to users. Each test has advantages and disadvantages which make it particularly suitable for use in connection with particular products, but not others, and thus it is generally necessary for a manufacturer or testing agency to be able to perform a number of different types of safety compliance tests in order to meet the different testing requirements for different products.

Insulation quality has traditionally been measured using a procedure referred to as the insulation resistance test. The insulation resistance test measures the quality of insulation in a product or component by applying a voltage corresponding to the rated voltage of the product and determining the total resistance of all elements situated in the path of current between the test points to which the voltage is applied. This test is simple and accurate, but cannot detect certain causes of incipient failure such as pinholes, weak insulating materials, inadequate spacing of components, and pinched insulation.

Another way to test the quality of insulation is to measure leakage current to ground at operating voltages of an electrical product. This is generally accomplished by connecting an ammeter between an isolated part of the product being tested and its neutral conductor, and measuring any current sensed by the ammeter when the operating voltage is applied.

A further variation of the conventional leakage current is the dielectric withstand test, also known as the hipot test, which also measures leakage current, but involves applying a higher voltage to the two points, so as to stress the insulation far beyond what it will encounter during normal use, and measuring stray current through the insulation. For most applications, this test requires application of an AC or DC test voltage of at least twice the normal operating voltage of the product being tested, plus 1,000 volts.

AC hipot testing is more generally accepted by safety compliance agencies than DC hipot testing because AC testing stresses insulation in a manner that more closely simulates stresses the product will see in normal use. Since AC testing cannot charge a capacitive load, the current reading remains consistent from initial application of the voltage to the end of the test, and there is no need to gradually bring up the voltage unless the product is sensitive to a sudden application of voltage. In addition, unlike DC hipot testing, AC hipot testing does not necessitate discharge of the electrical product being tested after the test has been completed. However, disadvantages of AC hipot testing include the effect on test results of reactive currents due to capacitances in the product, which are difficult to distinguish from leakage currents, and the greater power required in the presence of both reactive and leakage currents.

DC hipot testing, on the other hand, has the advantage of requiring less power than AC hipot testing because reactive currents are not present and also because the charging current only needs to be applied long enough to charge the item under test. On the other hand, DC hipot testing has the disadvantage that the voltage must be ramped slowly to the full test voltage so as to prevent the charging current from giving false indications of failure. In addition, DC hipot testing is disadvantageous because it requires that the product being tested be discharged after testing, and because the test can only charge an item to one polarity, rather than alternating polarities as in AC testing.

Ground circuit testing has generally involved performing a low current continuity test on the ground circuit of the product being tested, and determining whether a threshold amount of current, for example current sufficient to light an indicator lamp, passes through the ground circuit. While continuity tests utilize simple low power circuitry and reliably indicate the presence or absence of a ground connection, however, they do not test the integrity of the connection, and thus many applications call for stress tests, referred to herein as ground bond tests, which measure the actual impedance of the circuit at relatively high currents. Current ground bond testing standards require test currents of between 10 and 30 amps at test voltages of less than 12 volts. Because of the small impedance of a ground circuit, the ground bond test requires that the kelvin method or an offset be used to account for the resistance of test leads or other connections which are not part of the ground circuit being tested.

B. Conventional Test Instruments

The present invention concerns an instrument that adds insulation resistance and ground circuit test capabilities to an AC/DC hipot test instrument, using common power and measurement circuitry to the extent possible in order to eliminate redundant circuit elements which would increase the cost and weight of the instrument. While all of the above-described tests are well known to those skilled in the art of safety compliance testing, and most safety compliance regulations specify the types of tests that must be performed on a particular product, the present invention is unique in combining AC and DC hipot test instrumentation with instrumentation capable of carrying out insulation resistance and ground circuit tests, including in one preferred embodiment of the invention the capability of carrying out ground bond tests.

It has of course been previously proposed to provide instruments capable of carrying out a variety of different electrical safety compliance tests. However, while instruments capable of supplying different output voltages for insulation resistance and leakage tests, or of combining continuity and leakage current test capabilities are described in a number of prior publications and are currently commercially available, the unique nature of dielectric withstand or hipot tests has heretofore prevented effective or commercially viable integration of hipot test equipment with instruments also designed to carry out insulation resistance and ground circuit impedance tests.

Examples of prior instruments capable of performing leakage current and ground circuit tests, but only at line or operating voltages, rather than voltages sufficient to stress the insulation of the products being tested, are found in U.S. Pat. Nos. 2,968,763, 3,170,115, 3,643,157, 3,704,411, 3,878,458, 3,963,981, 4,578,637. While some of the insulation resistance testers use a voltage higher than the 110/220 volt line voltage, none provides a voltage high enough to accomplish dielectric withstand testing, and none provides more than three different types of tests. An example of an instrument which provides three different types of tests is disclosed in U.S. Pat. No. 3,141,128, but none of the three tests provided by the disclosed instrument meets the hipot requirement of applying a voltage of at least one thousand volts plus twice the operating voltage of the product being tested, the three tests instead being a low voltage ground impedance test, a 750 volt DC insulation resistance test, and a test for leakage current at the 120 volt AC operating current.

In contrast to the combined ground and insulation test instruments described in the above-cited patents, a conventional DC hipot leakage test instrument such as the one disclosed in U.S. Pat. No. 5,514,967 does not provide any sort of insulation resistance or ground circuit impedance testing. Even the state-of-the-art power circuitry described in U.S. Pat. No. 5,548,501, aspects of which are used in the power circuitry of the preferred embodiment of the present invention, and which provides for both AC and DC high voltage outputs, fails to include any provision for combining the high voltage power supply with insulation and ground bond test circuitry.

One of the principal reasons why combinations of low voltage ground circuit and leakage resistance test equipment with hipot test equipment has not previously been achieved is the different set-up and usage protocols required for the instruments. Hipot test equipment presents significant risks to the operator because of the high voltages involved, particularly during setting of the voltage and current trip parameters which, in conventional hipot instruments, is carried out at full power, and during calibration of the equipment which, in conventional instruments, requires difficult and time consuming manual adjustment of potentiometers. In an instrument that simply combined prior instruments, the greater number of outputs and adjustments would unacceptably increase the chances of operator error and risk of injury, particularly if the operator were to mistakenly set a high voltage parameter for a low voltage test.

Such safety and ease-of-use concerns, combined with difficulties in combining such disparate instruments in an efficient manner, have thus far precluded any attempts to combine AC and/or DC hipot test instruments with insulation resistance and ground circuit test equipment. As a result, the present invention is the first to provide the capability of performing all four types of tests using a single instrument.

SUMMARY OF THE INVENTION

It is therefore a first objective of the invention to provide a safety compliance test instrument capable of performing insulation resistance and ground circuit tests as well as high voltage AC and DC dielectric withstand or hipot tests, and yet which uses integrated power supply and measurement circuitry.

It is a second objective of the invention to provide a safety compliance test instrument capable of performing insulation resistance and ground circuit tests as well as AC and DC hipot tests, and yet which offers the user a simple interface enabling output parameters for all four types of tests to be set using a unified data entry procedure.

It is a third objective of the invention to provide an electrical safety compliance instrument which provides for stress testing of both insulation and ground circuitry while minimizing risk to the operator by using preset test protocols selectable from an operator interface which eliminates the need to run high voltages or currents in order to set the voltage and current trip parameters.

It is a fourth objective of the invention to provide an electrical safety compliance test instrument that eliminates the need for manual adjustment of potentiometers during calibration, enabling the operator to calibrate the instrument by entering meter readings from a standard meter using the front panel keypad of the instrument, the calibration values being automatically written to the non-volatile memory of the test instrument.

It is a fifth objective of the invention to provide an electrical safety compliance test instrument that provides settable high and low current or impedance limits, with appropriate visual and audible warnings that the limits have been exceeded, as well as a real time digital display of actual current or resistance values.

It is a sixth objective of the invention to provide an electrical safety compliance instrument that provides the capability of disabling arc detection for products, such as power tools and appliances with motors where low level arcing during a test may not be a sign of incipient failure.

It is a seventh objective of the invention to provide an electrical safety compliance instrument that optionally provides multiple high voltage and current outputs in order to enable the instrument to sequentially test different circuits in an electrical product, or multiple products, without the need to reset the instrument for each test.

It is an eighth objective of the invention to provide a safety compliance test instrument capable of performing high voltage AC and DC hipot tests, an insulation resistance test, and a ground circuit test, and in which the ground circuit test is a ground bond test that measures not only the continuity of the ground circuit, but also its integrity.

It is a ninth objective of the invention to provide, in a multiple function safety compliance test instrument capable of performing AC and DC hipot tests as well as insulation resistance and ground circuit tests, a circuit capable of preventing charging currents from triggering a high limit warning.

It is a tenth objective of the invention to provide, in a multiple function safety compliance test instrument capable of performing AC and DC hipot tests as well as insulation resistance and ground circuit tests, a circuit which automatically detects whether an electrical product to be tested is properly connected.

It is an eleventh objective of the invention to include, in a multiple function safety compliance test instrument capable of performing both AC and DC hipot tests as well as insulation resistance and ground circuit tests, a circuit which automatically and safely discharges capacitances in the DC hipot test circuit following a test.

These objectives are achieved, in accordance with the principles of a preferred embodiment of the invention, by providing a safety compliance test instrument capable of: (1) outputting an adjustable DC voltage having a maximum amplitude of at least 1000 volts and of measuring leakage current through the insulation in a device to which the high voltage is applied in order to perform a dielectric withstand or hipot test, (2) outputting an adjustable AC voltage having a maximum amplitude of at least 1000 volts and of measuring leakage current through the insulation in the device to which the high voltage is applied, (3) outputting a DC voltage of between 100 and 1000 volts and applying it to a device in order to perform an insulation resistance test on the device and display an equivalent resistance of the device, and (4) outputting a low voltage AC current sufficient to measure an impedance of a ground circuit to which the AC current is applied.

As described in greater detail below, these functions are made possible by including in the preferred instrument a microprocessor-based controller and power supply circuit including a potential transformer for converting input line power to a low voltage sinusoidal waveform, a rectifier for converting the low voltage sinusoidal waveform output by the potential transformer to a low DC voltage, a multistage amplifier which can be controlled by the microprocessor to supply a low voltage, high current, high precision, 50 or 60 Hz output for a ground bond test, a voltage amplifying transformer for converting the output of the multistage amplifier into a high voltage AC output for use in AC hipot tests, and a rectifying circuit for converting a high voltage AC output into a DC voltage for use in DC hipot and insulation resistance tests. In addition to controlling the voltage output, the microprocessor controller of the preferred embodiment of the invention is further arranged to control a plurality of relays or switches for selecting the appropriate measurement circuitry for the four different tests, including high and low limit values in response to direct inputs from a keypad or remote interface, or to retrieval of pre-stored test parameters from an electrically read only memory.

In an especially preferred implementation of the preferred embodiment of the invention, the microprocessor controller includes an operator interface arranged to permit test parameters, including voltage and current levels, test duration, and ramping times, to be pre-programmed or set for each of the four types of tests through a keypad accessible to a user of the instrument and a menu driven display screen, and which also permits calibration of the instrument based on meter readings that can be input through the keypad in order to avoid the need for manual adjustments of potentiometers.

According to still further aspects of the preferred embodiment of the invention, the microprocessor controller includes a remote interface that permits pre-programmed test functions to be initiated through a remote input port, and pass/fail indicator functions to be reviewed via a remote output port in order to enable manual control of the instrument from a remote location, and the microprocessor controller further includes interfaces capable of enabling full programming, data reading, and data recording functions to be carried out by remote computer software for fully automated operation of the instrument. In addition, according to yet another aspect of the preferred embodiment of the invention, the instrument includes provision for an optional scanner interface that permits high and low voltages to be output through a plurality of different ports, thereby enabling different points on a device or devices under test to be sequentially scanned.

In yet another aspect of the preferred embodiment of the invention, the microprocessor controller is arranged to set the impedances of measurement circuitry that detects a leakage current or ground circuit current by controlling a plurality of relays, and high and/or low limits by supplying appropriate threshold signals to limit comparators which signal failure if a limit is exceeded during the test period. Microprocessor control of the high and low limits further permits the inclusion of features such as a "ramp high" feature that raises the high limit during charging of a test product in response to application of a high DC voltage so as to avoid triggering of the high limit due to charging currents, and a "charge low" feature that utilizes a low current limit during the initial application of power to a product in order to detect the charging current and thereby automatically detect whether the product has been properly connected to the test instrument. In addition, microprocessor control can be used to facilitate such additional functions as the setting of arc detection sensitivity, the frequency of the AC outputs, and offsets for the impedance of test leads in the case of low impedance ground circuit testing.

BRIEF DESCRIPTION OF THE DRAWINGS

FIG. 1 is an elevation showing the front panel of a multiple function safety compliance instrument constructed in accordance with the principles of a preferred embodiment of the invention.

FIG. 2 is an elevation showing the rear panel of the multiple function safety compliance instrument illustrated in FIG. 1.

FIG. 6B is a schematic circuit diagram of various power connections included on the main control board shown in FIG. 3.

FIG. 12A is a schematic circuit diagram showing details of the high limit and arc detection setting connections between the central controller circuitry shown in FIG. 12 and the power control circuitry shown in FIG. 9.

FIG. 12B is a schematic circuit diagram showing details of the main power and impedance network switching connections between the controller circuitry shown in FIG. 12 and the power and the high voltage control relays shown in FIG. 11.

FIG. 12C is a schematic circuit diagram showing details of the LCD driver portion of the main control board shown in FIG. 3.

FIG. 12D is a schematic circuit diagram of the remote input connector circuitry included on the main control board shown in FIG. 3.

FIG. 12E is a schematic circuit diagram of remote output driver circuitry included on the main control board shown in FIG. 3.

DETAILED DESCRIPTION OF THE PREFERRED EMBODIMENTS

Figure 3:
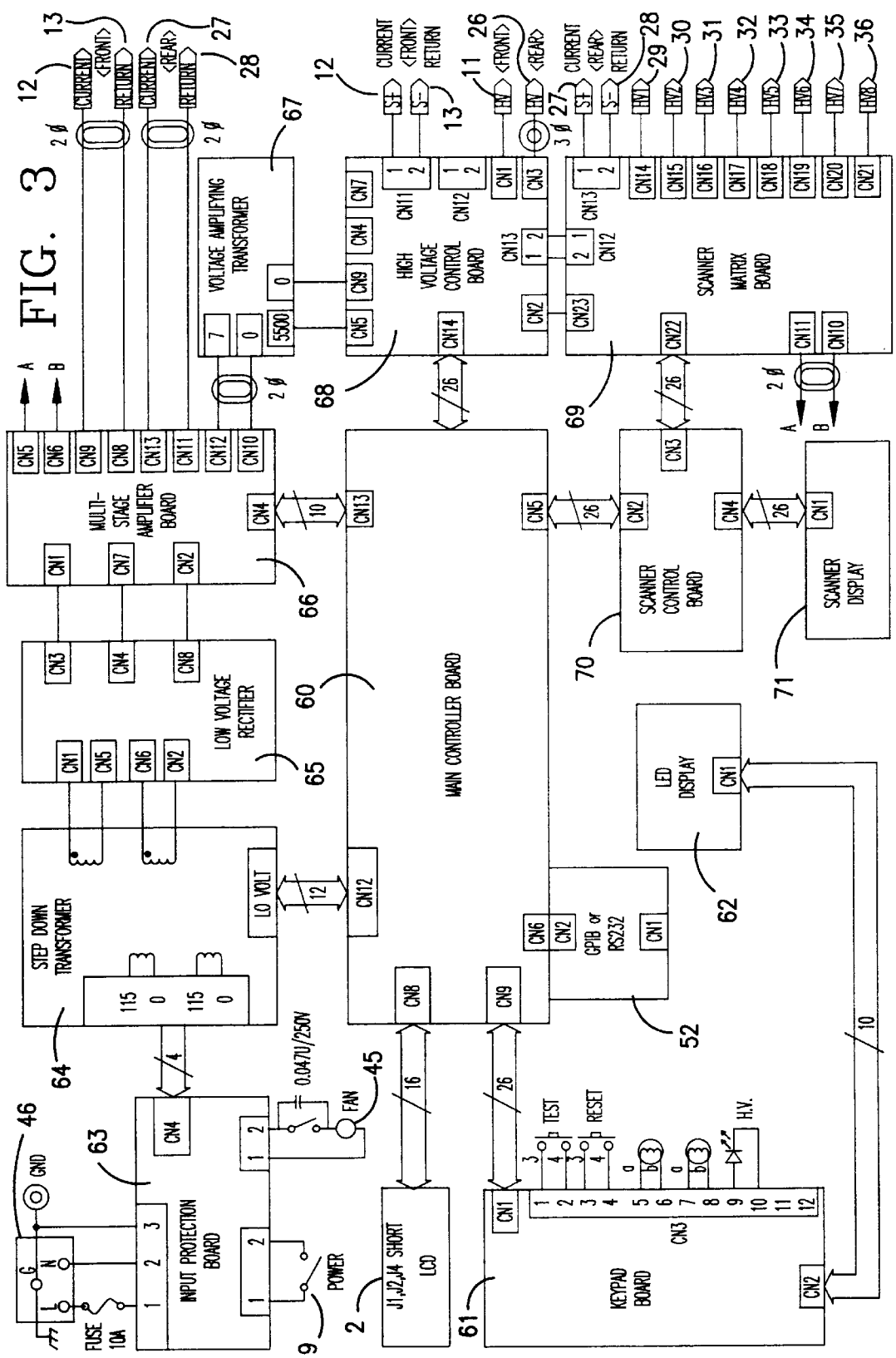
FIG. 3 is a schematic diagram of the control and power circuitry used in the multiple function safety compliance instrument illustrated in FIGS. 1 and 2.

FIGS. 1 and 2 illustrate a preferred layout of the front and rear panels which provide the operator and test interfaces for the instrument of the preferred embodiment of the invention, FIG. 3 shows a circuit board layout for the instrument illustrated in FIGS. 1 and 2, and FIGS. 4–17 show specific implementations of the circuitry illustrated in FIG. 3.

The following description begins with an introductory passage concerning the use in the drawings of part numbers and component values, such as resistances, and is followed by descriptions of the front and rear panels of the illustrated safety compliance test instrument, a main operator interface, power circuitry, measurement and analysis circuits, an optional scanner, and remote computer interfaces.

Part Numbers and Values Shown in the Drawings

While specific implementations of the circuitry of the preferred embodiment of the invention are illustrated in great detail below, so that anyone skilled in the art can implement the invention based on the specific circuit elements and values shown in the drawings, it should be appreciated by those skilled in the art that the drawings contain numerous aspects which are not part of the invention, but rather are included for completeness and to show the best mode of practicing the invention. Disclosure of these details will enable anyone skilled in the art to make and use the invention, but is not intended to limit the invention in any way.

For example, each of the integrated circuits shown in the drawings is identified by a part number which can be used to obtain the integrated circuit from manufacturers, using catalogs available from various chip makers as well as directories such as the "Chip Directory" available on the Internet at a number of mirror sites, including http:\\www.acl.co.uk. Although included in the illustrated embodiment, however, these integrated circuits are in general equivalent to other integrated circuits which perform similar functions, and substitution of these circuits, as well as the corresponding power supply and input/output circuits, is intended to be within the scope of the invention. One skilled in the art would, as a matter of routine, be able to make changes to the illustrated circuitry without departing from the basic principles of the invention.

Because the functions of the individual resistors, diodes, op amps, and other illustrated circuit elements are in general apparent from the illustrations and will be readily understood by those skilled in the art, detailed explanations are only given with respect to elements that specifically illustrate or implement the principles of the invention. The skilled artisan is therefore invited to view the remaining values and standard part numbers given in the drawings as providing but one operable example of an instrument which incorporates the broader principles of the invention.

A detailed description of the preferred embodiment follows:

Layout of the Front and Rear Panels

FIG. 1 shows, by way of illustration, the arrangement of the front panel 1 of a safety compliance instrument constructed in accordance with the principles of the preferred embodiment of the invention.

Front panel 1 includes an LCD display screen 2 for displaying test results and menus used to select or program test parameters, and a keyboard 3 for enabling entry of the test parameters based on the displayed menus. Also included on the front panel are an LED 4 which illuminates upon detection of an arcing condition, an LED 5 for indicating whether a password software lockout has been enabled to prevent programming of the instrument via the keyboard in order to change test settings, and an LED 6 for indicating when the instrument is in a remote control mode. Front panel 1 may also include scanner status LEDS 7 for indicating the status of optional multiple high voltage and ground continuity test ports.

In addition to keyboard 3, front panel 1 includes an illuminated test button 8 for initiating a high voltage test, and an illuminated reset button 10 for enabling the system to be reset before proceeding to the next test following shut-off of the power circuitry upon detection of a hazardous condition such as an out-of-range leakage current, arc breakdown, or ground bond failure, the test and reset button being respectively illuminated to indicate a pass or fail condition. Overall power to the instrument is supplied by a main power switch 9.

Upon pressing of the test button, power to the test leads (not shown) is supplied by either a high voltage output jack 11, used for the hipot and insulation resistance tests, or by a current output jack 12, which supplies a high current for ground bond testing. The return for both the high voltage and high current outputs is through jack 13. An additional LED indicator 14 indicates whether a high voltage is present at the high voltage output.

The rear panel 25 of the illustrated test instrument also includes a high voltage output jack 26, a current output jack 27 for use in ground bond testing, and a return jack 28 identical in function to the front panel high voltage, current, and return jacks. In addition, in the case where a scanner is provided, the rear panel provides eight high voltage outputs 29–36, which are scanned in the manner described below, eight ground bond test outputs 37–44, and a common port 55. Also illustrated in FIG. 3 are a cooling fan 45, an AC line input 46 for a standard power cord, a fuse receptacle 47, optional scanner connectors 48 and 49, a remote signal output 50 for remote control of test and reset functions as well as program memory selection, a remote signal input 51 for monitoring pass, fail, and processing output relay signals, and a standard connector 52 for interconnection of an IEEE 488, RS-232, or other standard computer interface. Finally, the rear panel includes a chassis ground 53 and a switch 54 for selecting between 110–120 volt operation and 220–240 volt operation.

The main test parameters, selectable via keypad 3 from menus on the LCD display 2, are the voltage or current levels of the outputs, high and low current limits, the duration of the test (dwell time) and ramping functions, the level of arc detection, and in the case of an AC output, the output frequency. In addition, various functions such as a charge low function, which provides a low current limit during DC testing indicative of the absence of charging currents and therefore of an improper connection, and a ramp high function which raises the high limit during charging to prevent the high current limit from being triggered by the charging currents, may be set using the keypad 3.

The output voltage levels for the DC and AC hipot tests are respectively adjustable in one volt steps from 0 to 5 KV AC at 40 mA and 0–6 KV DC at 10 mA, with the LCD display having two resolutions in the AC mode of 0.001 mA/step for a range of 0.000 to 3.500 mA of detected leakage current, and of 0.01 mA/step for a range of 3.00 mA–40.00 mA, and DC mode resolutions of 0.1 $\mu$A/step for 0.0 $\mu$A to 350.0 $\mu$A, 1 $\mu$A/step for 300 $\mu$A to 3500 $\mu$A, and 10 $\mu$A/step for 3000 $\mu$A to 9990 $\mu$A. The preferred range of output voltages for the insulation resistance test is 100 to 1000 volts DC, with a display of the resistance ranging from 1 to 9999 M$\Omega$ and various resolutions, and in the ground bond test mode of 3.00 to 8.00 volts AC and current range of 0.00 to 30 Amps, and a resistance display in the range of 0 to 600 m$\Omega$.

Keypad Layout

Keypad 3 includes various function and number keys for programming test parameters such as voltage and current, as described above, for the four different available tests. For example, included in the illustrated example are a numeric keypad 15, respective keys 16 for initiating display of menus on LCD display 2 through which parameters for the AC and DC hipot, insulation resistance, and ground bond tests may be entered, and various programming related keys such as a memory key 17, a lock key 18, a step key 20, an exit key 21, a setup key 27 used to enter the program mode, up/down arrow keys 23, and an enter key 24. When the keypad 3 is in an unlocked mode, pressing of one of the function keys 16 will cause the display to provide a menu of the various settings possible for the function. The up/down arrow keys 23 may then be used to progress through the test parameters menu, with the numeric keys 15 and an enter key 24 being used to input specific settings and the exit key 21 being used to exit the setting mode of operation.

The lock key 18 is used to toggle a function which prevents changing of test parameter settings, and may be activated or deactivated in response to entry of a password following pressing of the lock key. The memory key 17 is used to access a particular memory location, each of which contains eight separate steps, with each step containing four separate locations, one for each function, and recall the test parameters stored in that location. The step key 20 shows the test parameters of the functions selected for a particular step. The local key 19 allows selection of remote or local operation.

Those skilled in the art will appreciate that the exact layout and types of keys can be varied in numerous ways while still enabling a user to select desired parameters for the various tests, using the circuitry illustrated in the remaining figures.

The AC withstand or hipot test has four parameters which can be set using keypad 3 and the corresponding menu display. The five main parameters are the AC output voltage, which can range from 0–5000 volts in 1 volt steps, the high limit current setting, which can range from 0.00 to 40.00 mA in 0.1 mA steps, the low limit current setting, which can range from 0.000 to 9.999 mA in 0.001 mA steps, the ramp time setting, which can range from 0.1 to 999.9 seconds in 0.1 second increments, and the dwell time setting, which can range from 0.3 to 999.9 seconds in 0.1 second steps. In addition, menus allow an output frequency for the AC withstand test of either 60 or 50 Hz to be selected, an arc detection sensitivity to be set, and an arc fail mode to be toggled on and off.

The low and high limit current settings give the range of acceptable leakage currents. Whenever a detected current is outside the range defined by the high and low settings, a failure is indicated and the power circuitry of the instrument is shut-down until the reset button is pushed.

The dwell time setting is the time that a test voltage or current is applied to the device being tested, while the ramp time setting sets the interval during which the load is brought to full voltage and measurements are begun. Normally, the ramp time will be zero during AC testing, although some products may be sensitive to the sudden application of voltage. In DC testing, on the other hand, the ramp time depends on the capacitance of the product being tested, with sufficient time being required to permit charging currents to decay to a negligible level.

The DC withstand voltage test parameters are the high and low limit current settings, the ramp time and dwell time settings, and arc sensitivity settings. In addition, the DC withstand test includes a ramp-high feature which when toggled on allows an increase in the high current limit during ramping to prevent large charging currents from triggering the limit setting, and a charge low feature that provides a minimum current setting ranging from 0.0 to 350.0 $\mu$A at 0.1 $\mu$A per step, which is active during ramping to monitor the charging current. If a charging current is not detected, then a warning is provided to indicate that the device under test may not be properly connected.

Each of the test and reset functions can be controlled through the remote signal input 51, which in the illustrated embodiment of the invention is in the form of a 9-pin D subminiature male connector connected to the circuitry shown in FIG. 12D. Pass, fail, and processing output relay signals are provided through the remote signal output 50, which is in the form of a 9-pin D subminiature female connector, the driver circuitry for which is shown in FIG. 12E. In addition, set-up and test functions can be carried out remotely via a complete IEEE 488 bus interface in the form of a standard GPIB connector, or an optional RS-232 connector, making the instrument adaptable to any type of automated production environment.

Overall Circuit Board Layout (FIG. 3)

The overall layout of the circuitry for the test instrument illustrated in FIGS. 1 and 2 is illustrated in FIG. 3. The main control board 60 includes a microprocessor and memory chips, and is connected by busses or cables to the various interface and power boards. Operator input functions are controlled by a keypad board 61, while a separate board 62 is provided for the front panel LEDs 4–6.

The power circuitry is provided on an input protection board 63, which provides a 115/230 volt selector switch, the main on/off switch, and a fused input 46 for a power cord. The 115 volt output of the input protection board is supplied to a transformer 64, which in turn is connected to circuitry on a rectifier board 65, a multi-stage amplifier board 66 and, via a voltage amplifying transformer 67, a high voltage control board 68, each of which is described in more detail below.

The arrangement of the various circuits on discrete circuit boards is of course optional, but is preferred because it provides a degree of modularity to the instrument. In addition, it permits optional inclusion of a scanner matrix board 69, scanner control board 70, and scanner display 71, in order to provide for multiple high voltage and current outputs. Especially advantageous is the arrangement of the amplifier and high voltage control boards, with the amplifier board supplying the high current outputs directly to the current jacks 12 and 27 used for the ground bond test, and the voltage amplifying transformer converting the output of the amplifier board to a low current, high voltage, high precision AC waveform which can be switched by relays on the high voltage control board to supply high voltage AC and DC outputs to the high voltage jacks 11 and 26. Also advantageous is the placement of the high/low limit circuitry and voltage control circuitry on the main control board since this circuitry requires interfacing with circuitry on both the amplifier and high voltage control boards as well as with the main microprocessor control circuitry. While the basic rectifier-amplifier-transformer-AC/DC switching arrangement is also used in the circuit described in U.S. Pat. No. 5,548,501, cited above, the use of the amplifier to directly supply the high current outputs, as well as specifics of the limit and voltage setting circuitry, are unique to the present invention.

Figure 4:
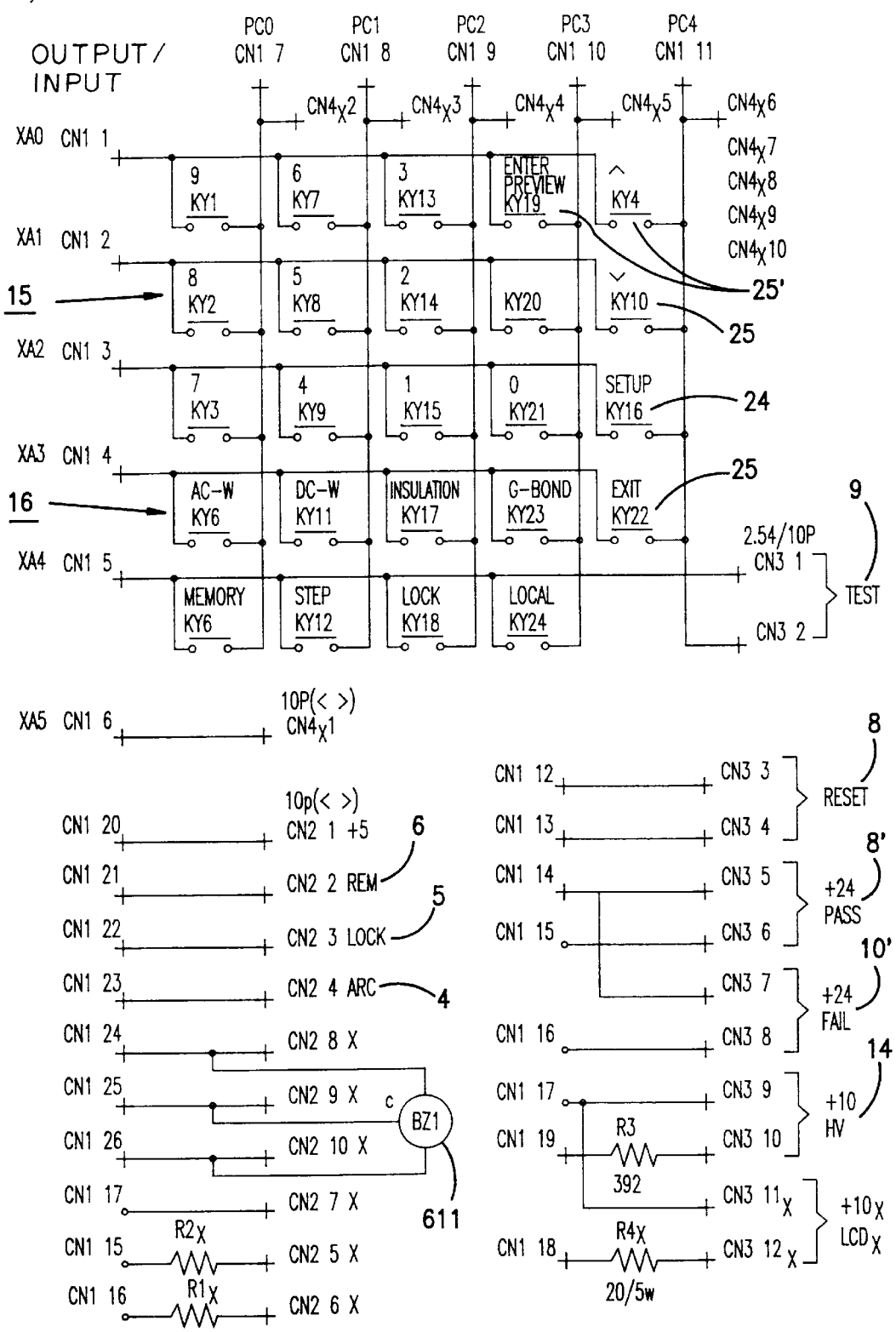
FIG. 4 is a schematic circuit diagram showing details of the keypad circuit board shown in FIG. 3.
Figure 5:
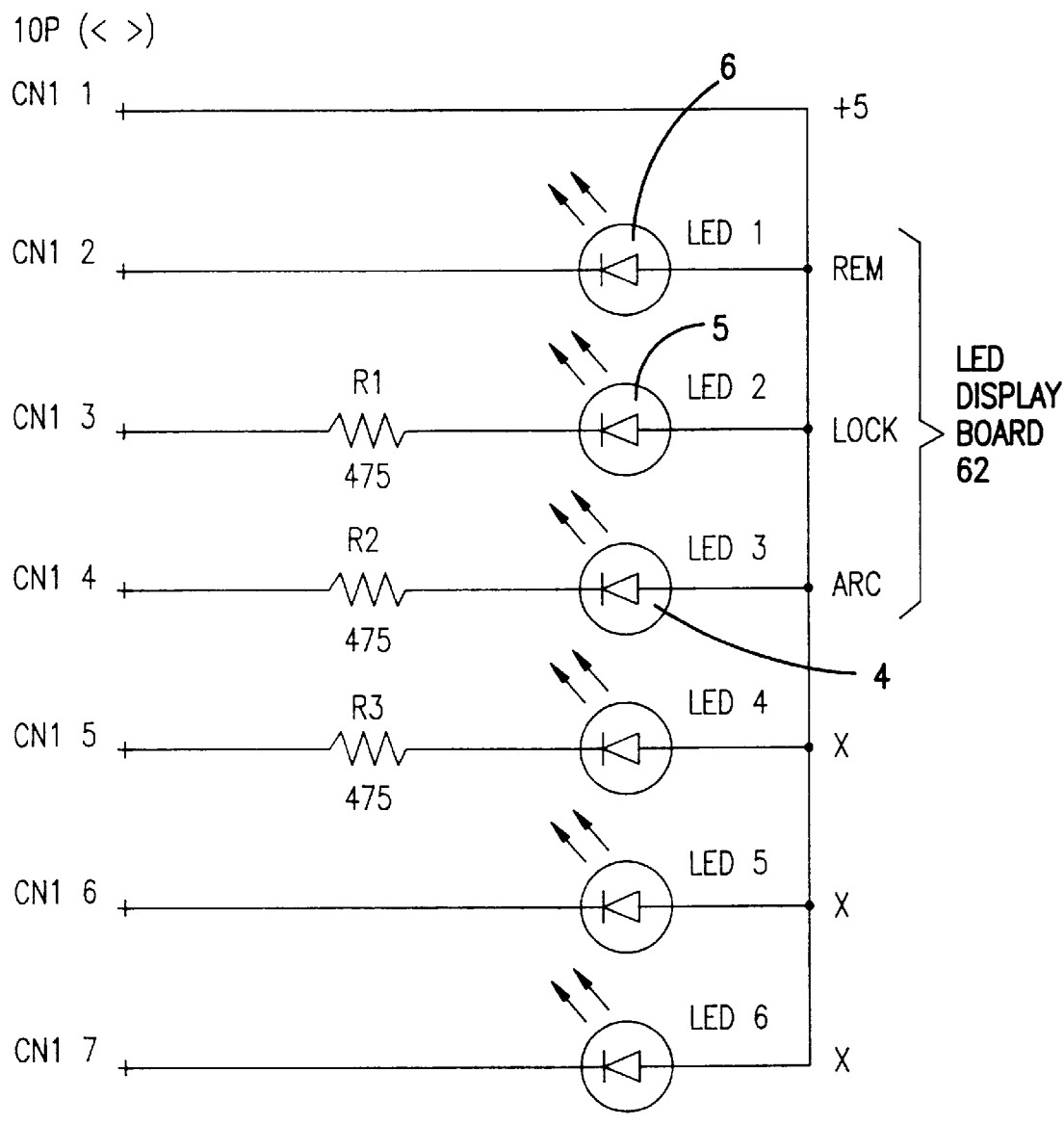
FIG. 5 is a schematic circuit diagram showing details of the LED display board shown in FIG. 3.

Keypad and Display Boards (FIGS. 4 and 5)

The arrangement of the keypad and LED display boards 61 and 62 is not per se part of the present invention, except insofar as the keypad and displays of the present invention are used to provide an integrated operator interface for setting up and performing the four types of tests which the invention is designed to carry out. As a result, it will be appreciated that the details of the keyboard and display circuitry may be freely varied without departing from the scope of the invention.

Figure 4A:
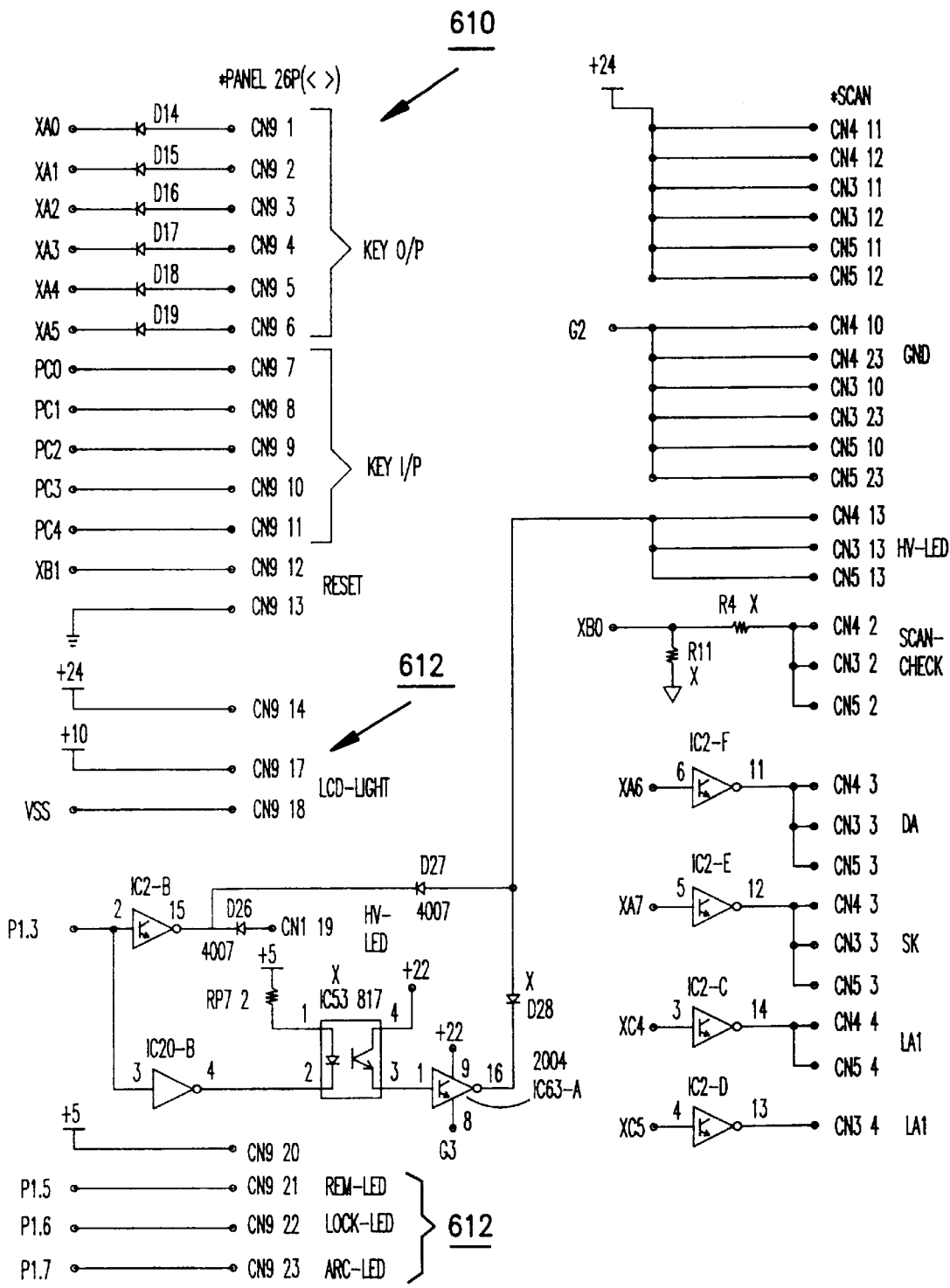
FIG. 4A is a schematic circuit diagram showing details of the keypad interface connections between the controller circuitry shown in FIG. 12 and the keyboard control board circuitry shown in FIG. 4.
Figure 12:
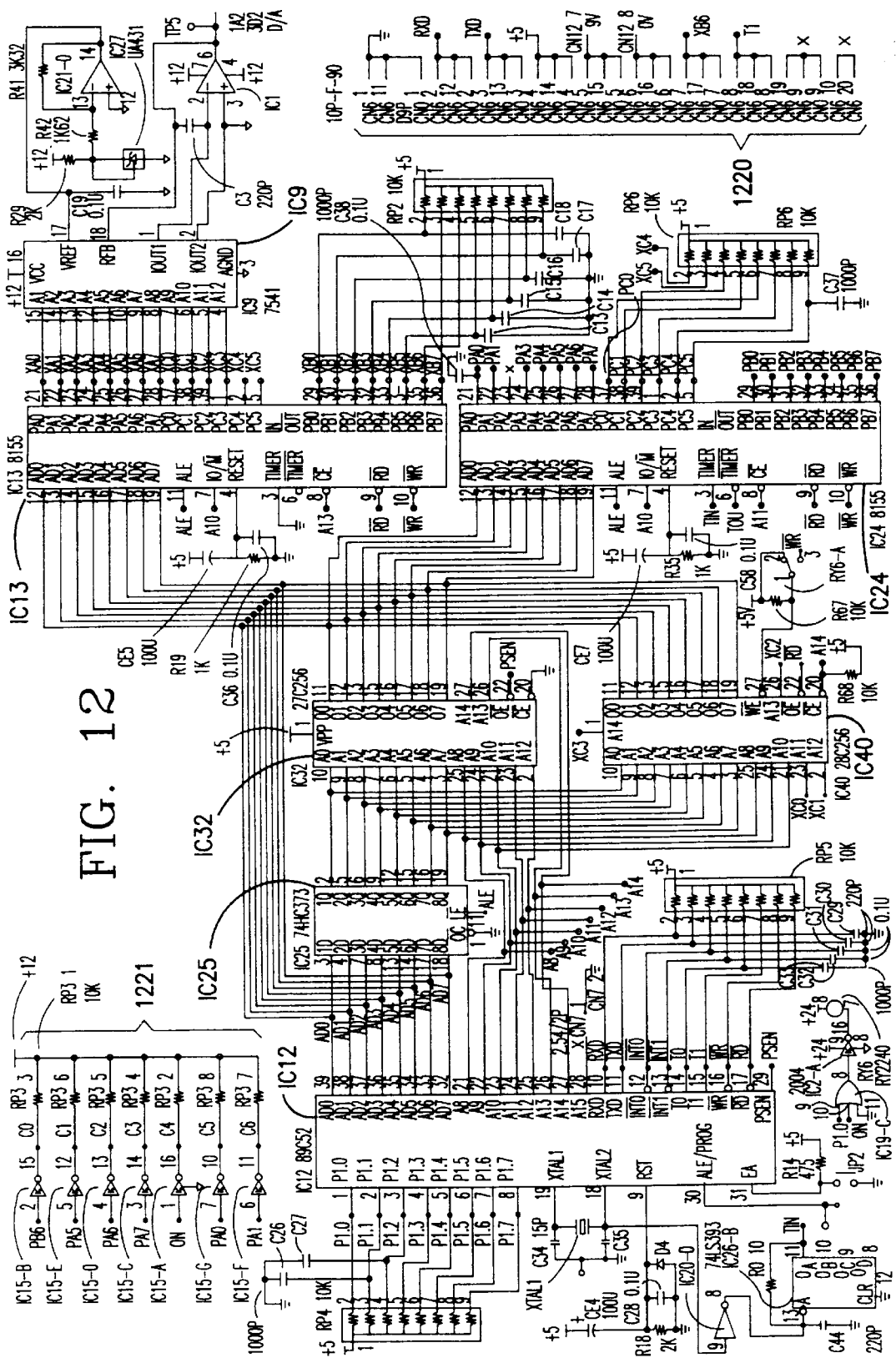
FIG. 12 is a schematic circuit diagram showing details of the micro-processor based controller portion of the main control board shown in FIG. 3.

As illustrated in FIG. 4, the keypad is driven by signals XA0 to XA5, which are supplied by the circuit 610 shown in FIG. 4A, and which are passed back to circuit 610 as signals PC0 to PC4 depending on the state of the button-activated switches on the keypad board 61. Input of signals indicative of keypad status to the microprocessor IC12, shown in FIG. 12, is via buffer IC24. In addition, keypad board 61 carries signals for indicating pressing of the test and reset buttons 8 and 10, as well as for illuminating the respective button LEDs 8' and 10' to indicate pass and fail conditions, for illuminating the high voltage indicator light 14, and for activating a buzzer 611 to indicate a hazardous condition or provide other appropriate audible indicators.

Figure 14:
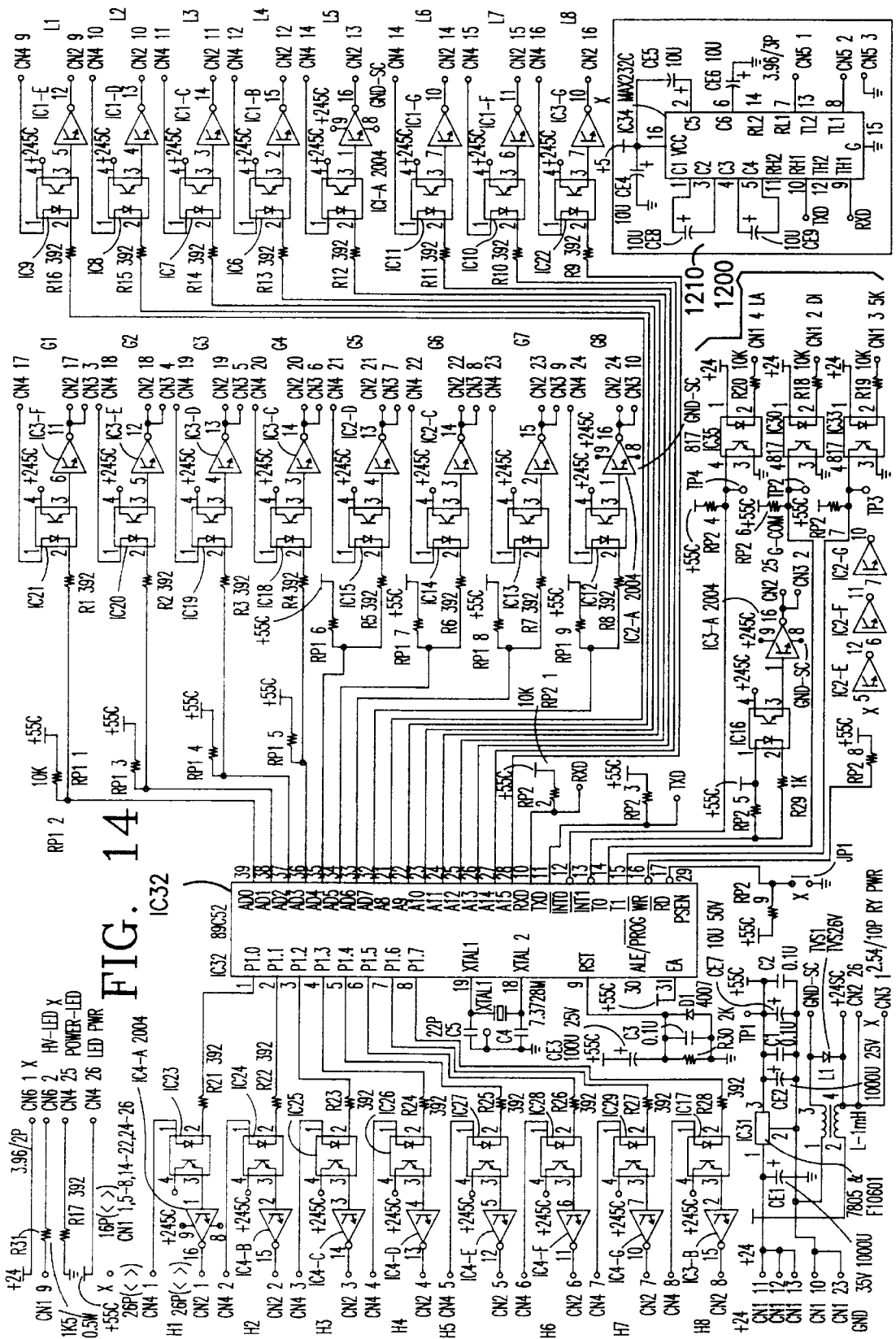
FIG. 14 is a schematic circuit diagram showing details of the optional scanner control board shown in FIG. 3.

Each of the visual indicators is controlled directly by the microprocessor IC12 via circuits 612, shown in FIG. 4A, which are connected directly to the indicated pins on the microprocessor. The audible indicator control signal is provided via a buffer circuit IC24, shown in FIG. 12, and an output multiplexer IC11 and amplifier 614 shown in FIG. 12A. Circuit elements 1200 shown in FIG. 14 provide outputs from the main controller to the optional scanner boards described in more detail below.

It will be noted that the "CN# ##" designations including in the drawings are terminal or line designations for the cables connecting the circuit boards, with CN1 1 to CN1 26 indicating terminals on the keypad board 61, which are connected by a 26 line cable to terminals CN9 1 to CN9 26 on the main control board 60. This is evident from FIG. 3, which shows the corresponding cable extending between terminals CN1 and CN9. Similar cable line identifiers are used throughout the drawings but will, in the interest of conciseness, not generally be mentioned further in this description although those skilled in the art can trace the necessary connections based on the terminal and line numbers shown in the drawings. A number of the lines, such as lines 5–7 of terminals CN1 on boards 61 and 62, which are connected to spare LEDs, are not used in the illustrated embodiment, but are the result of using commercially available or generic parts, not all terminals or lines of which are utilized, as will be understood by those skilled in the art.

Figure 6:
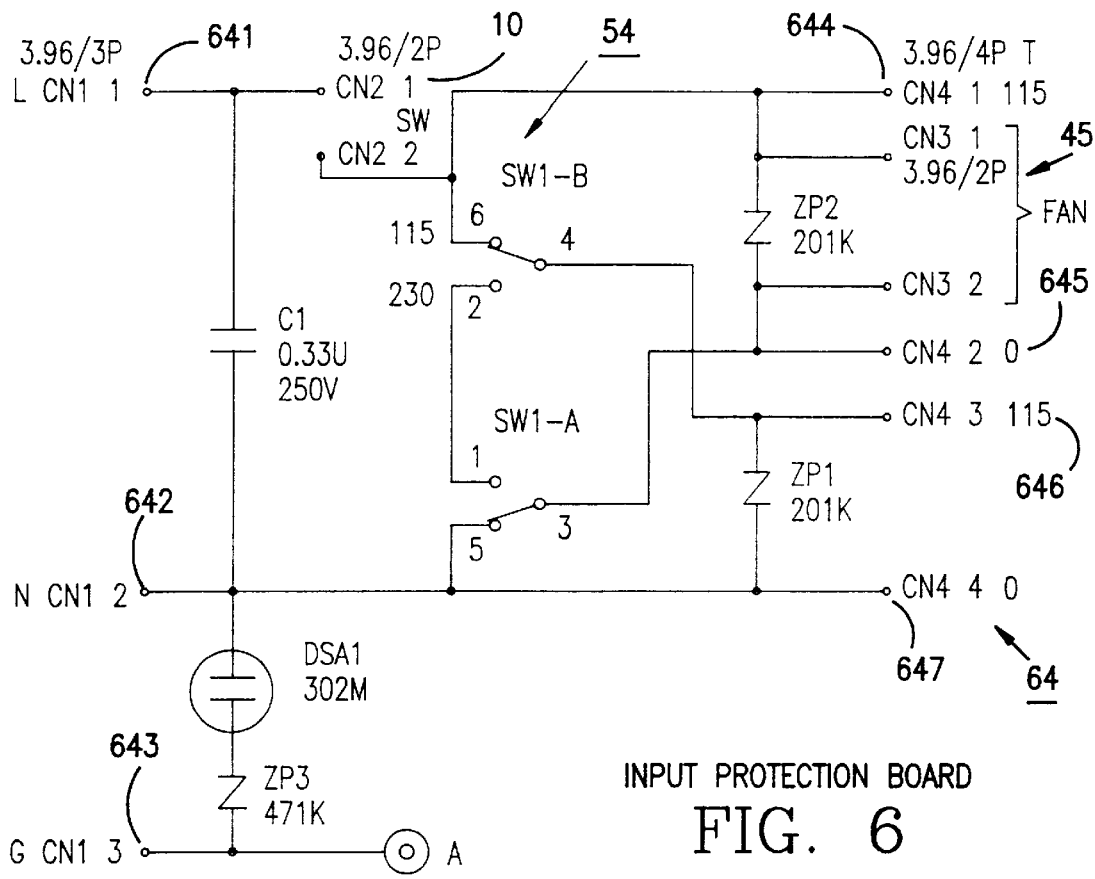
FIG. 6 is a schematic circuit diagram showing details of the input protection board shown in FIG. 3.
Figure 7:
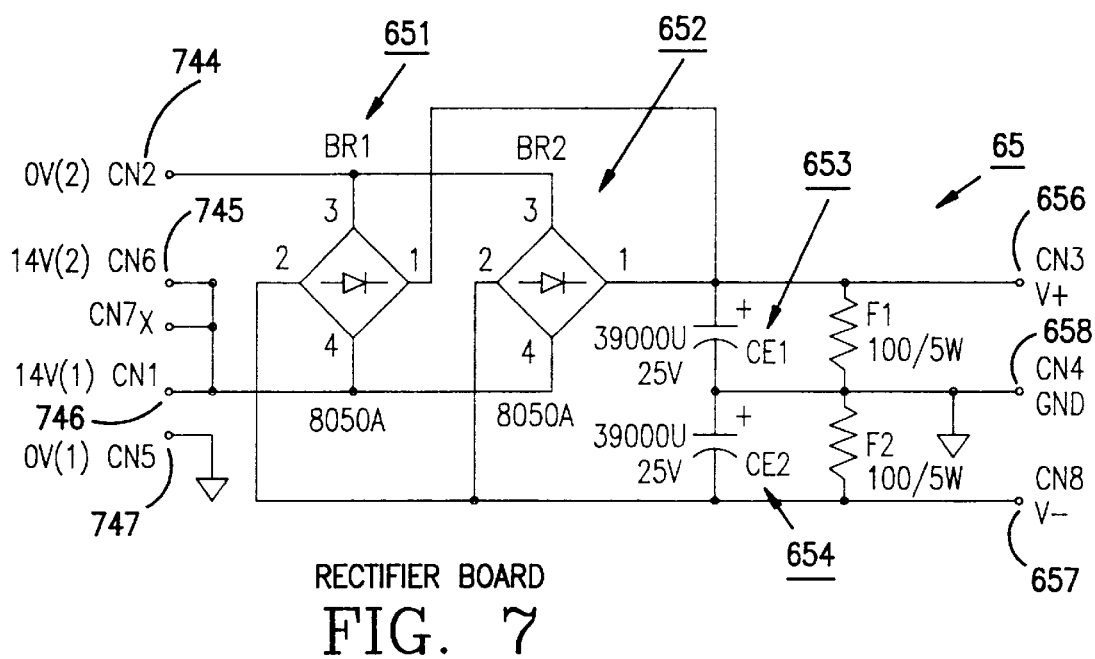
FIG. 7 is a schematic circuit diagram showing details of the rectifier board shown in FIG. 3.
Figure 8:
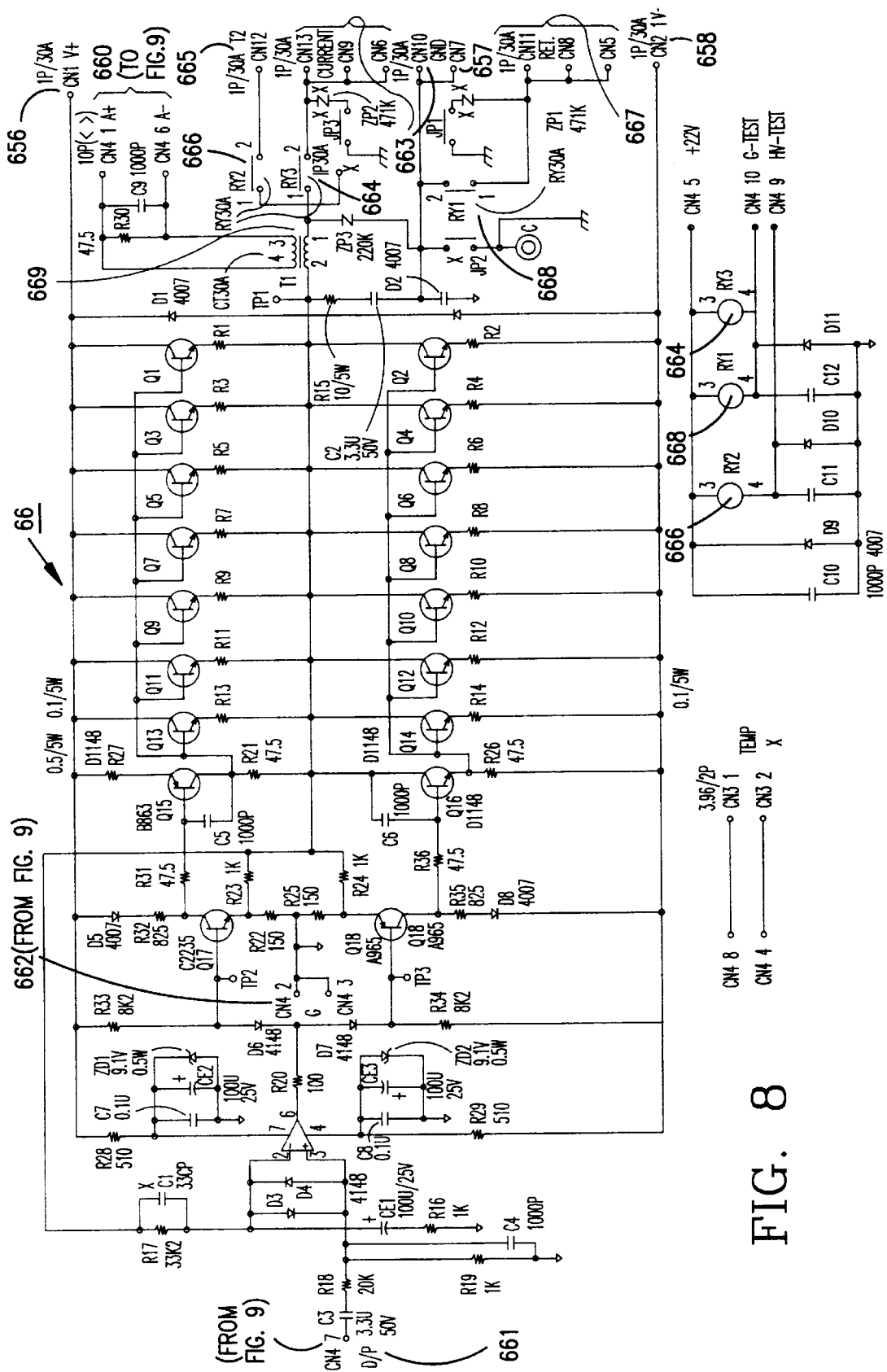
FIG. 8 is a schematic circuit diagram showing details of the multistage amplifier board shown in FIG. 3.

Power Circuitry (FIGS. 6–8)

The power circuitry of the present invention converts a 115 or 230 volt input line voltage into four different types of outputs selectable via the keypad or a remote input. As indicated above, the four types of outputs are a 5 KV at 40 mA AC output and a 6 KV at 10 mA DC output suitable for hipot testing, a 100–1000 volts at 12 mA DC output suitable for insulation resistance testing, and a 3 to 8 volts at 3 to 30 amps AC output suitable for ground bond testing.

The circuitry for providing these outputs with the required tolerances operates by first stepping down the line voltage and then rectifying the resulting low voltage for input to a multi-stage amplifier capable of providing signals having a range of output voltages at relatively high currents. These high current signals are suitable for use directly as current outputs for the ground bond test, and in addition are provided to a voltage amplifying transformer which provides the final insulation resistance and hipot test voltages. Circuitry on the secondary side of the voltage amplifying transformer is used to switch between a direct output of the voltage amplified AC signal and rectification circuitry for providing the final DC hipot and insulation resistance test outputs.

More specifically, as shown in FIG. 3, the power circuitry includes a step down or potential transformer 64 which converts an input line waveform from an input protection board 63 to a low voltage, the low voltage being rectified by a rectifier board 65 to supply a power input to main power amplifier board 66, the output of which is either a current for the ground bond test or a precision voltage supplied to a voltage amplifying transformer 67, and high voltage control board 68, with output voltages and currents being supplied from high voltage control board 67 to the front and rear high voltage jacks 11 and 26, current output jacks 12 and 27, and return jacks 28 and 13.

The high voltage board 67, as will be described in more detail below, also carries impedance networks used to detect leakage and ground circuit return currents. These networks are tapped to provide inputs to the current detection circuitry described below in connection with FIGS. 9 and 10.

Turning to FIG. 6, the input protection board includes a line input 641, a neutral input 642, and a ground connection 643 connected via a standard connector to a power outlet for receiving a 115 or 230 volt input line voltage. This voltage is switched by power switch 10 and supplied to fan 45 and to transformer 64 via terminals 644–647, which are switched according to the setting of the 115/230 V selector switch 54.

Transformer 64 converts the 115 V inputs from input protection board 63 into low voltage outputs supplied to the main control board 60 for powering integrated circuitry on the main control board and various peripheral devices such as the keypad and indicators using the main control board power lines shown in FIG. 6B, and a 14 V output supplied to rectifier board 65, shown in FIG. 7, which includes a pair of diode rectifier circuits 651,652, an RC filter network 653,654 connected between 14 V AC inputs 744–747, plus and minus DC outputs 656 and 657, and ground output 658.

Rectifier board 65 is in turn connected to a power amplifier board 66 which includes a multi-stage negative feedback transistor amplifier, as shown in FIG. 8, the input voltage to which is controlled by signal inputs 661 and 662 from the main control board, with the outputs to current jack 663 being controlled by relay 664 and to high voltage terminal 665 being controlled by relay 666, the return path being provided by terminals 667 and relay 668 being actuated by signals from the main control board.

Figure 9:
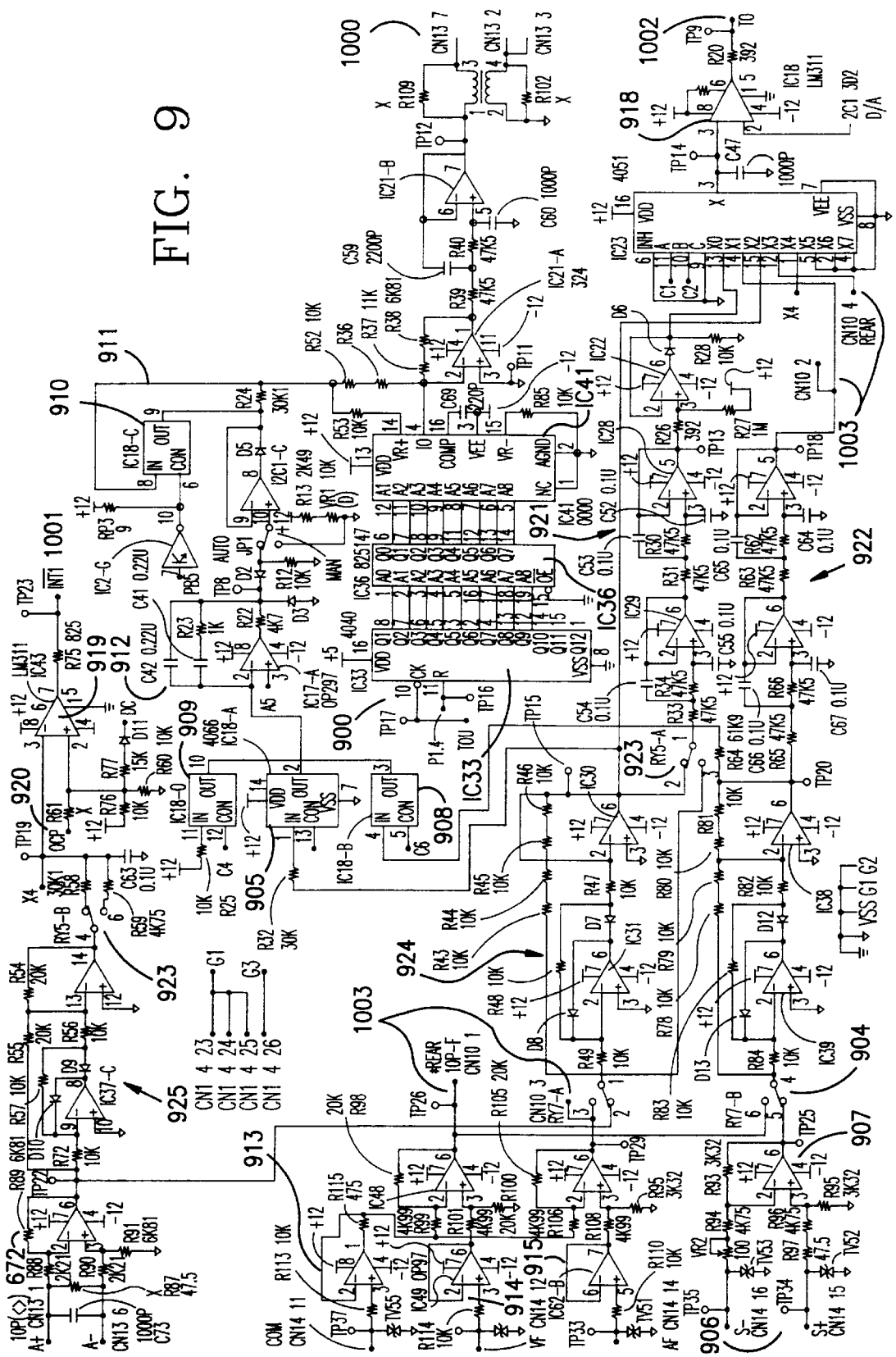
FIG. 9 is a schematic circuit diagram showing details of the power control and monitoring circuit portions of the main control board shown in FIG. 3.

The multiple stage amplifier shown in FIG. 8 is in the form of a negative feedback transistor amplifier consisting of transistors Q1 to Q18, collectively represented by reference numeral 66. Feedback to the main control board for purposes of monitoring the output current is provided by a transformer 669, which is connected via terminals 660 to voltage level monitoring circuit 672 on the main control board 60, as shown in FIG. 9. This feedback is supplied to both low and high limit detection circuits, described in detail below, and to a reset circuit which deactivates the voltage control upon detection of an out-of-range situation.

Control of the voltage output of the amplifier board, and therefore of the output voltages for both the current and high voltage jacks, is provided by the main control board circuit shown in FIG. 9, which has four main outputs 1000 to 1004. Output 1000 is connected to input 661 of the amplifier, and controls the voltage level of the amplifier output in response to a ramp circuit and a feedback circuit switchable between the high voltage leakage current and high voltage leakage current detection circuits. Output 1001 provides an indication that safe current levels have been exceeded, while output 1002 supplies the detected current levels to the microprocessor for analysis and display, and output 1003 supplies the detected current to an optional true current detection board which distinguishes true leakage currents from reactive and charging currents. The "true current" feature is used in conventional hipot testers and forms no part of the present invention.

The power circuit also includes a voltage amplifying transformer which supplies a high voltage AC output to a high voltage control board 68. High voltage control board 68 includes an AC/DC switching circuit and switched impedance networks for measuring the leakage currents as discussed in detail below in connection with FIG. 11. The impedance networks are tapped to provide inputs to the current detection and processing circuitry included on the main controller board 60 and discussed in detail below in connection with FIG. 9.

Figure 10:
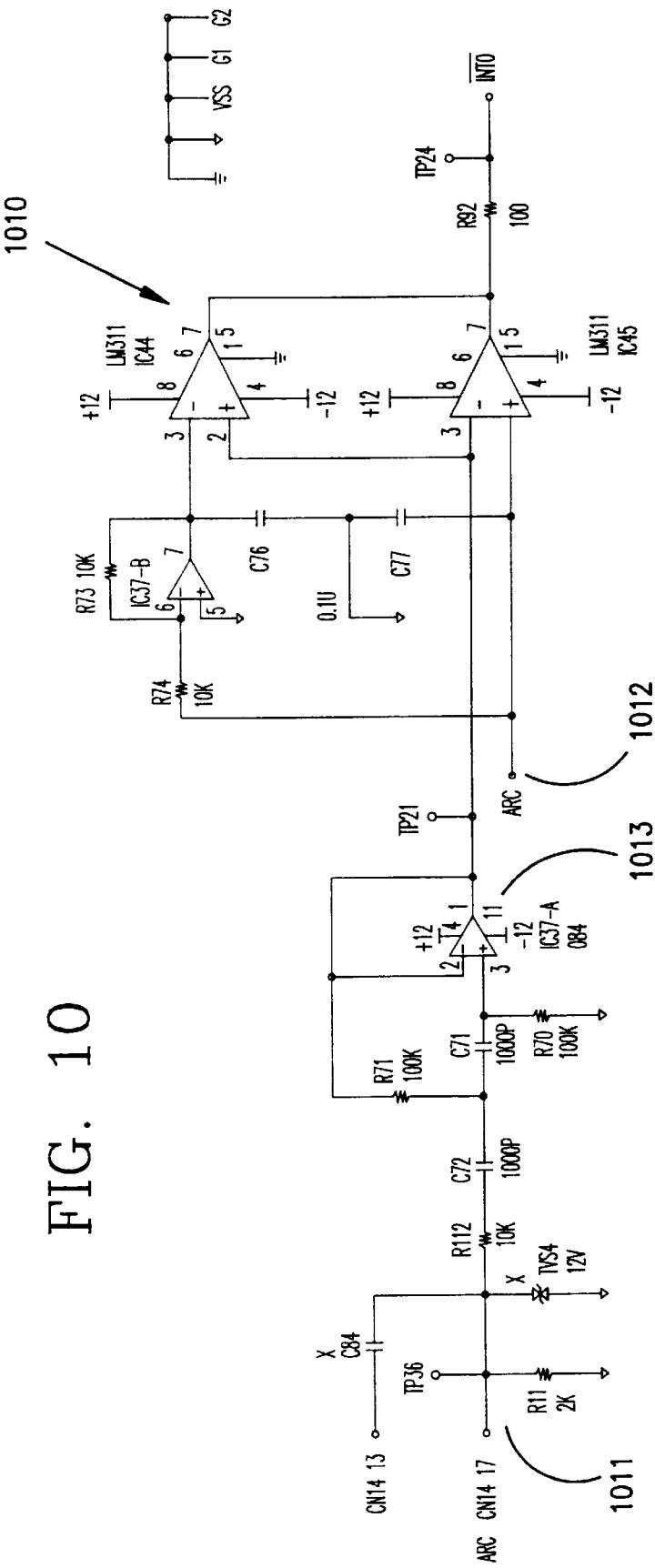
FIG. 10 is a schematic circuit diagram showing details of the arc detection circuit portion of the main control board shown in FIG. 3.

Voltage Level Control (FIG. 10)

The gain control input to the multistage amplifier on amplifier board 66 is provided by a ramp circuit which causes the amplifier to increase the voltage level in steps during charging of a capacitive test item for DC testing and by a switching circuit made up of analog switches 905, 908, and 909. The sine generator includes a twelve stage binary counter IC33, a programmable read only memory IC36 arranged to output increasing frequency levels in response to input 900 from main microprocessor IC12, and a D/A converter IC41, while switch 905 supplies feedback from transformer 660 in the amplifier circuit shown in FIG. 8 via op amp 672 when relay 904 is set to the high current test position, switch 908 supplies a signal from voltage monitoring terminals 906 on the high voltage control board shown in FIG. 11 via op amp 907 when relay 904 is set to the ground bond test position, and switch 909 provides a constant 12 volt reference. In addition, switch 910 adjusts the level of the feedback voltage by switching a resistor 911 into the feedback circuit, and integrator circuit 912 controls the voltage amplitude of the amplifier input control signal in response to a signal AS from the main control circuit shown in FIG. 12.

Figure 11:
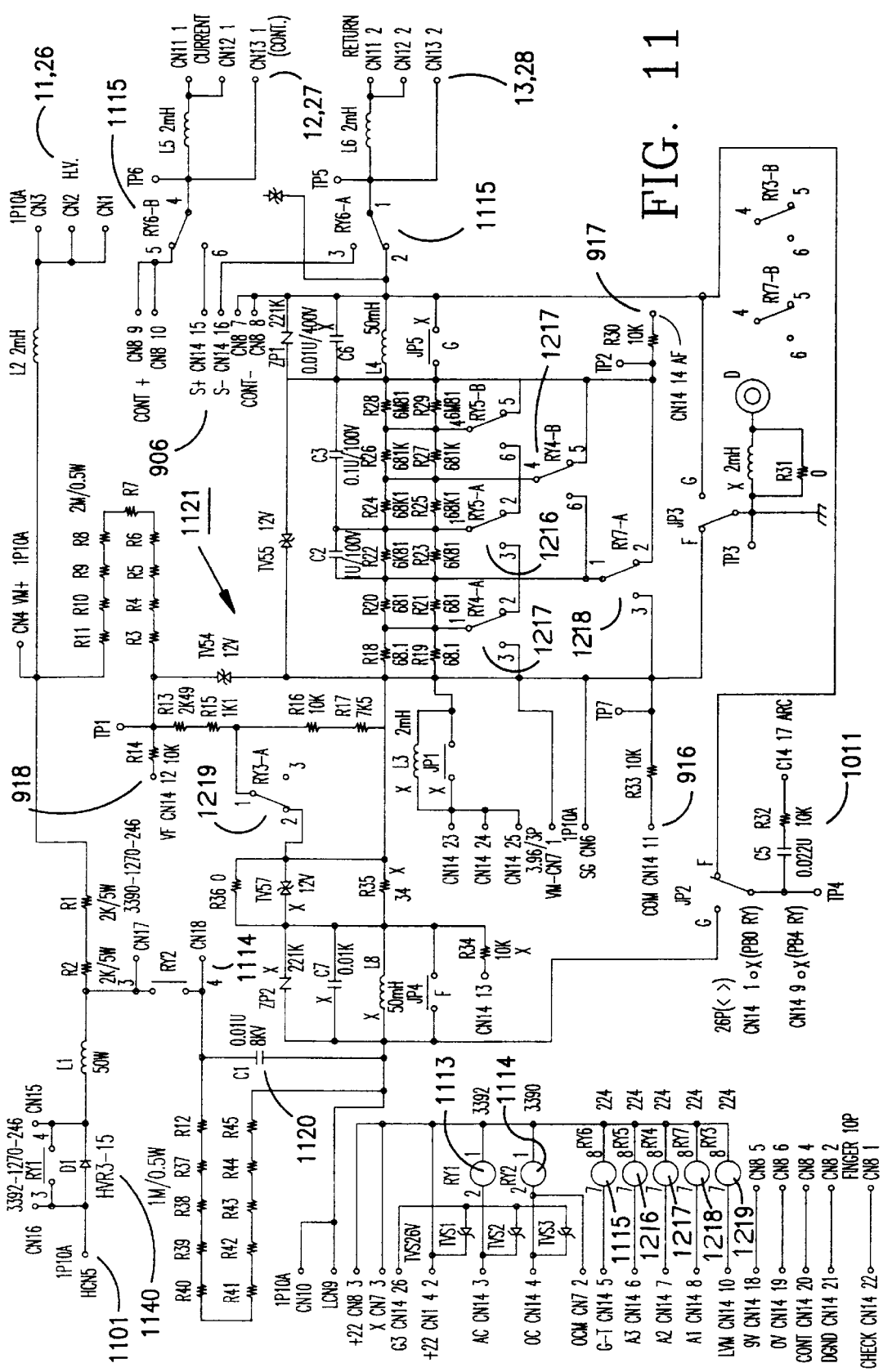
FIG. 11 is a schematic circuit diagram showing details of the high voltage control board shown in FIG. 3.

AC to DC Switching and Impedance Networks (FIG. 11)

The primary power circuit switching circuitry for the four tests is provided by the high voltage control board 68 illustrated in FIG. 11, and in particular by relays 1113–1119.

Switching of the high voltage output 11 and 26 from AC to DC is controlled by relays 1113 and 1114. The high voltage AC power supplied by the transformer is passed directly to outputs 11 and 26 from the transformer connection 1101 upon closure of switch 1113 and opening of switch 1114. When switch 1113 is opened and switch 1114 is closed, the power supplied by transformer 67 is rectified by diode 1140 and filtered by capacitor 1120.

Using the circuit disclosed in U.S. Pat. No. 5,548,501, herein incorporated by reference, the preferred embodiment is capable of discharging the filter capacitor 1120 following a DC withstand or insulation resistance test by closing relay 1113, in which case the capacitor will discharge back through the transformer 67 secondary winding.

High voltage control board 68 also includes a switchable impedance network 1121 across which the test results are measured. Relays 1216–1219 switch different impedances between the high voltage jacks 11,26 and return 13,28 in order to measure currents for the AC and DC hipot tests, and the insulation resistance test, based on control signals received from the microprocessor IC12 via the interface shown in FIG. 12B.

Current Detection Circuitry (FIGS. 9 and 10)

Relays 904 and 923 switch the control circuitry shown in FIG. 9 from ground bond test to leakage or charging current detection modes in which currents through the impedance networks of the high voltage board 68 shown in FIG. 11 are detected by op amp input circuits 913–915 connected respectively to terminals 916–918 on the high voltage control board. Relay 904 switches between inputs 914,915 and 672,906, while relay 923 inserts an RMS detector stage to the processing circuitry when relay 904 is switched to process ground bond and AC hipot test results, the remaining stages 921 and 922 of the processing circuitry providing to the multiplexer IC23 a voltage level corresponding to the detected leakage or ground currents depending on the state of relay 904.

Protection against overloads is provided by output 1001 of comparator 919, which compares the output of circuit 925 with a threshold to determine whether the current present at input 672 exceeds a safe limit determined by input 920 and the position of relay 923. Setting of the maximum overload threshold via input 920 is carried out by a signal output by buffer 920 and multiplexer IC11, both of which are shown in FIG. 12A.

The actual leakage or ground test currents on which the test results are based are detected by inputs 906, 672, 914, and 915, depending on the type of test being performed, and supplied by circuits 921–924 to a multiplexer circuit IC23, the output of which is sent via comparator 918 to the main controller circuitry. The second input of comparator 918 is supplied by buffer IC13 via multiplexer circuit IC9, shown in FIG. 12. Analysis of the signal supplied by output 1002 is carried out by the microprocessor IC12, described in more detail below, which evaluates the signal supplied by output 1002 using parameters entered by the operator using the keypad 3 or via one of the remote interfaces and displays the results.

The circuit shown in FIG. 10 is, like the circuit shown in FIG. 9, situated on the main controller board 60, and includes a peak comparator circuit 1010 having as inputs line 1011 from the high voltage current monitoring circuit shown in FIG. 11 and an arc detection threshold setting signal supplied via line 1012 from multiplexer IC11 and 1020 shown in FIG. 12A and input circuit 1013. The output of circuit 1010 is supplied directly to microprocessor IC12 shown in FIG. 12 as an interrupt which occurs upon detection of unacceptable arcing. The interrupt can be disabled in situations where arcing might be expected to occur normally during high potential testing of a product.

Digital Controller Circuitry

FIG. 12 shows the layout of the digital controller circuitry portion of the main circuit board. The main control and analysis functions are provided by microprocessor IC12.

In order to analyze the results of a test, microprocessor IC12 compares the detected current signals with high and low limits which depend on the type of test being performed and the setting made by the operator. In addition, low limit detection may be used even during initial application of power to provide a "charge low" feature for detecting a minimum charging current indicative of whether the tested product is properly connected and, in order to avoid an improper high limit indication resulting of charging currents present during an initial application of power during a DC hipot test, a "ramp high" feature is programmed into the microprocessor to cause the microprocessor to raise the high limit threshold during charging. The actual current levels are output by microprocessor IC12 to the LCD display 2 via lines 1030 included in the digital output circuit shown in FIG. 12C.

Although microprocessor IC12 is illustrated as being in the form of an 89C52 processor, available for example from Atmel, it will be appreciated that other microprocessors may be substituted, with corresponding modifications to the main control board, in order to perform the functions of IC12, and the invention is not to be limited to any particular microprocessor configuration. The pin numbers illustrated in FIG. 12 are defined by the IEEE standard for the type of microprocessor illustrated, and programming may be accomplished by the skilled artisan by reference to appropriate data sheets available from manufacturers of the microprocessor.

The remaining circuit elements in the digital portion of the main controller board are 2048 bit random access memories IC13 and IC24, which have an internal timer and are used as input/output control signal and data buffers, 32K EPROM IC32 and EEPROM IC40 which enable preset test programs to be stored, and digital-to-analog converter IC9. Also shown in FIG. 12 are lines 1220 to the computer interfaces, and output lines from buffer IC24 to multiplexer circuit IC11 shown in FIG. 12A.

Optional Scanner Control and Display

Figure 13:
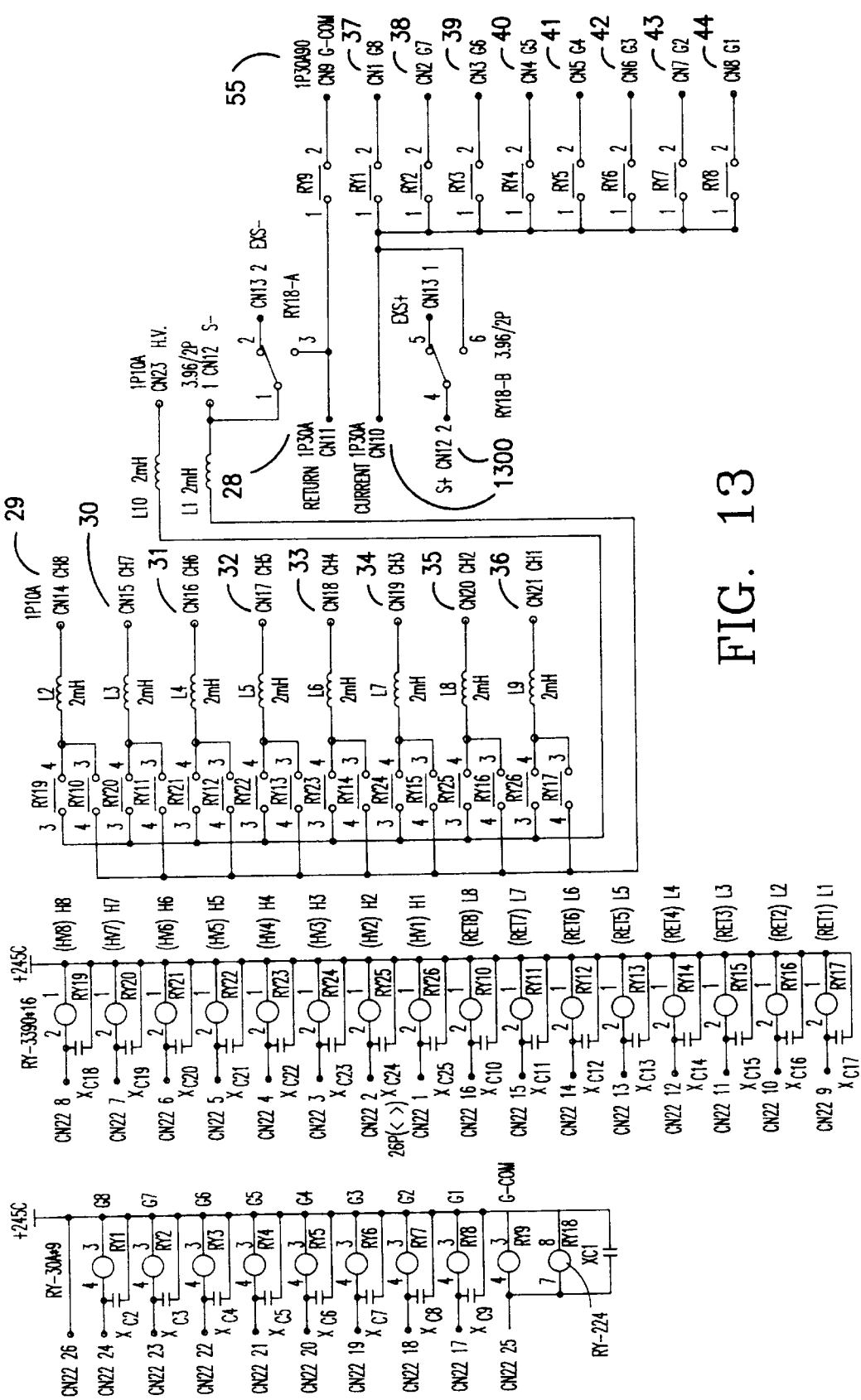
FIG. 13 is a schematic circuit diagram showing details of the optional scanner matrix board shown in FIG. 3.
Figure 15:
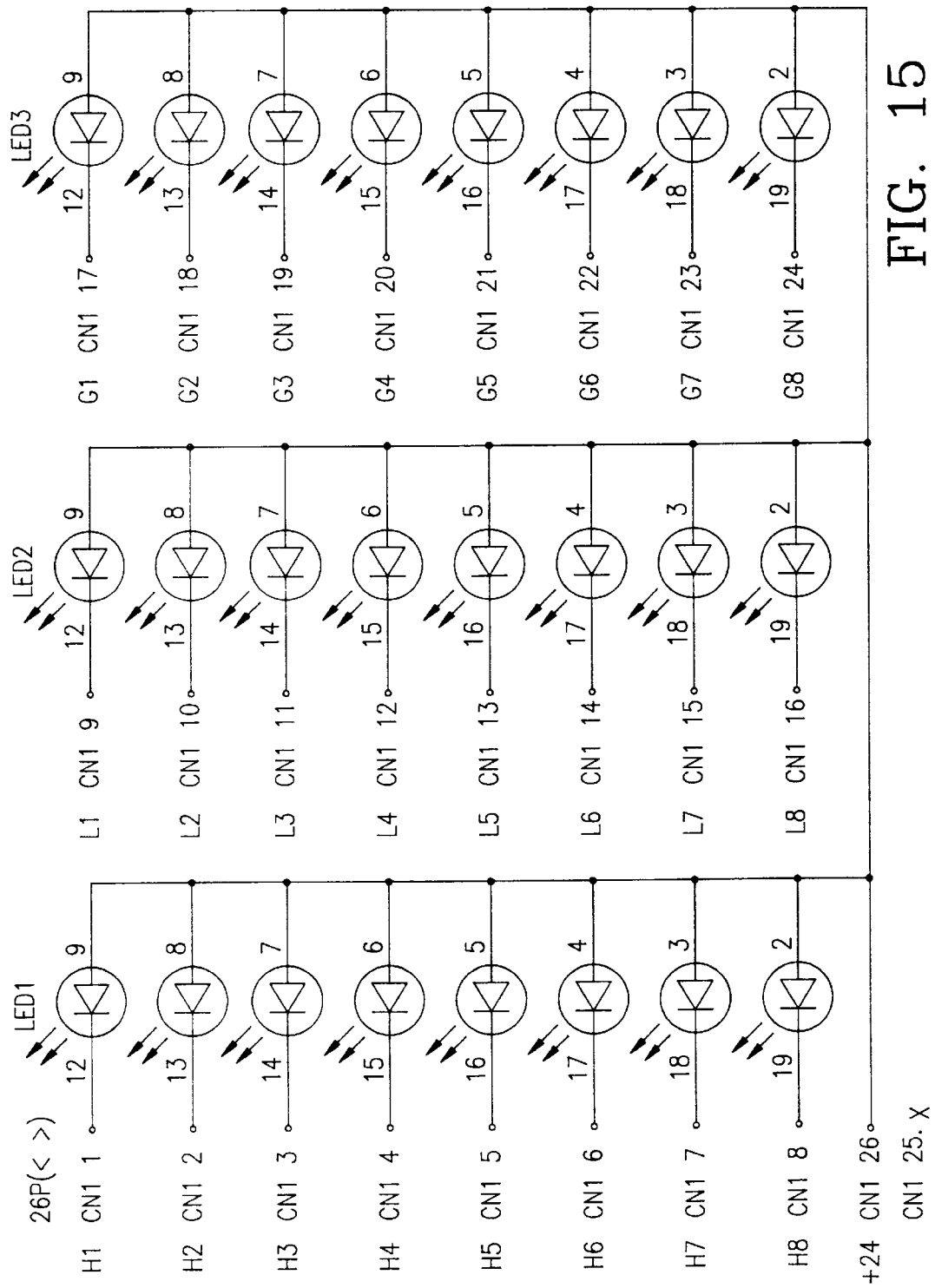
FIG. 15 is a schematic circuit diagram showing details of the scanner display board shown in FIG. 3.

FIGS. 13–15 depict the three optional scanner boards, including scanner matrix board 69, illustrated in FIG. 13, scanner control board 70, illustrated in FIG. 14, and scanner display board 71, illustrated in FIG. 15. The scanner provides eight high voltage ports and eight ground bond ports corresponding to rear panel jacks 29–36 and 37–44 shown in FIG. 13. The high voltage ports can be set to a high level, providing the capability of testing from port to port, or at a low level, providing the capability of testing from any port to a common low or return point. In addition, the ports can be connected in parallel if desired, although there is only one leakage current test for each port, which is carried out by the above-described circuitry on the high voltage control board 68. The ground bond ports can only test from one port to the common return, and only one port may be used for each test.

The various connections between the scanner ports or jacks are accomplished by a plurality of relays RY1–RY8 for switching the current input 1300 from multi-stage amplifier board 66 between current output jacks 37–44, relays RY19–RY26 for switching the high voltage input from high voltage control board 68 between high voltage scanner high voltage jacks 28–36, and relays RY10–RY17 for selectively connecting output jacks 29–36 to return jack 28 when relay RY18 is closed, all of which are provided on scanner matrix board 69. In addition, relay RY9 ties the return jack 28 to the ground/common jack 55 when closed.

The control signals G-COM, G1–G8, H1–H8, and L1–L8 for the various relays on the scanner matrix board are supplied by microprocessor IC32 via terminals CN2, as illustrated in FIG. 14, which correspond to terminals CN22 as shown in FIG. 13. Microprocessor IC32 may be of the same type as microprocessor IC12, although there is no requirement that the microprocessors be of the same type. The relay control signals G1–G8, H1–H8, and L1–L8 are also output to the LED display board via terminals CN4 to indicate which of the scanner jacks is active and whether the high voltage jacks are connected port to port for a high level test, or from any port to a common low or return point. Command signals for microprocessor IC32 are received from microprocessor IC12 via lines 1200 and the inverters shown in FIG. 4A, or via circuit and corresponding elements of circuit 1220 shown in FIG. 12.

Remote Interfaces

Figure 16:
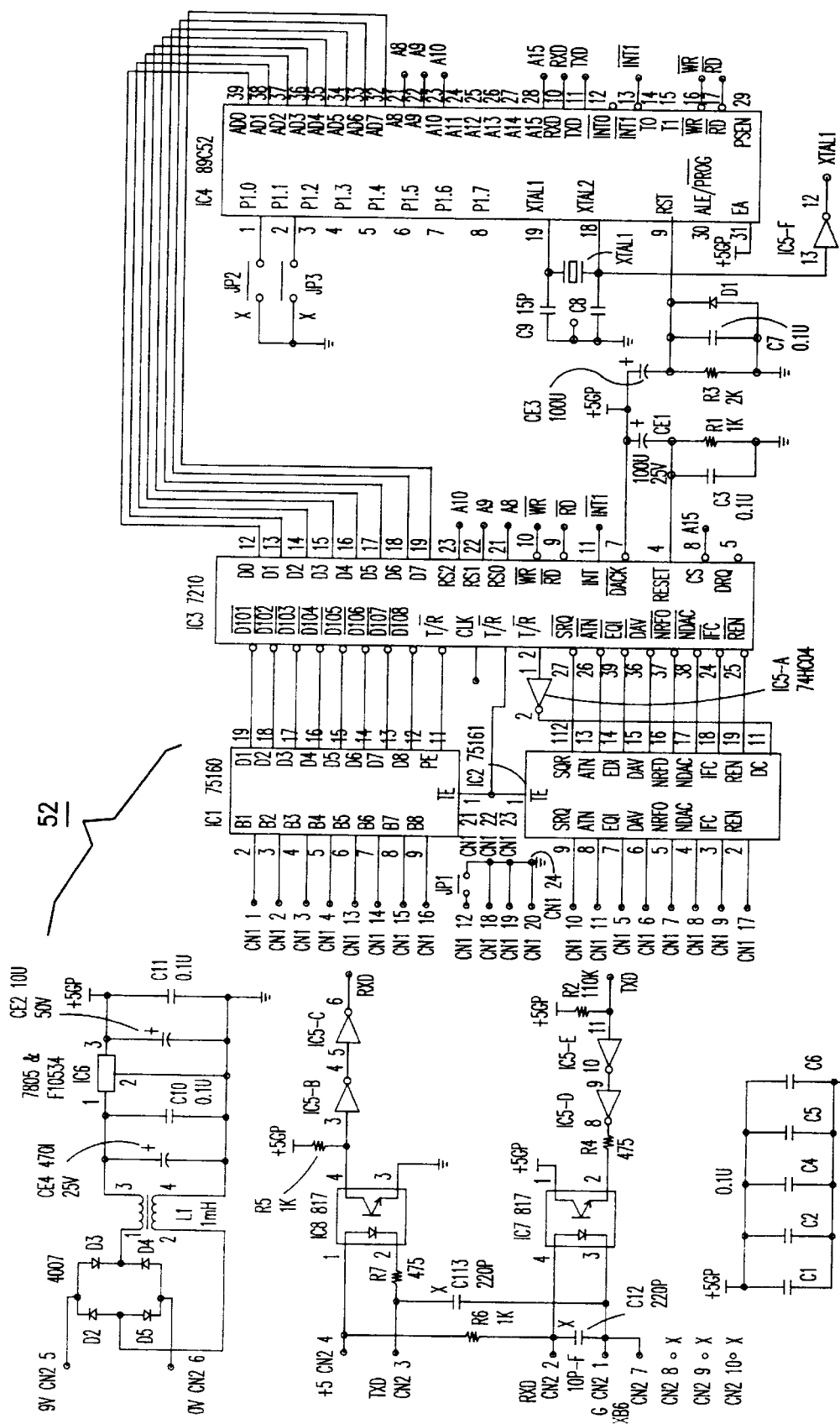
FIGS. 16 is a schematic circuit diagram showing a GPIB interface which may be used in connection with the safety compliance instrument of the preferred embodiment of the invention.
Figure 17:
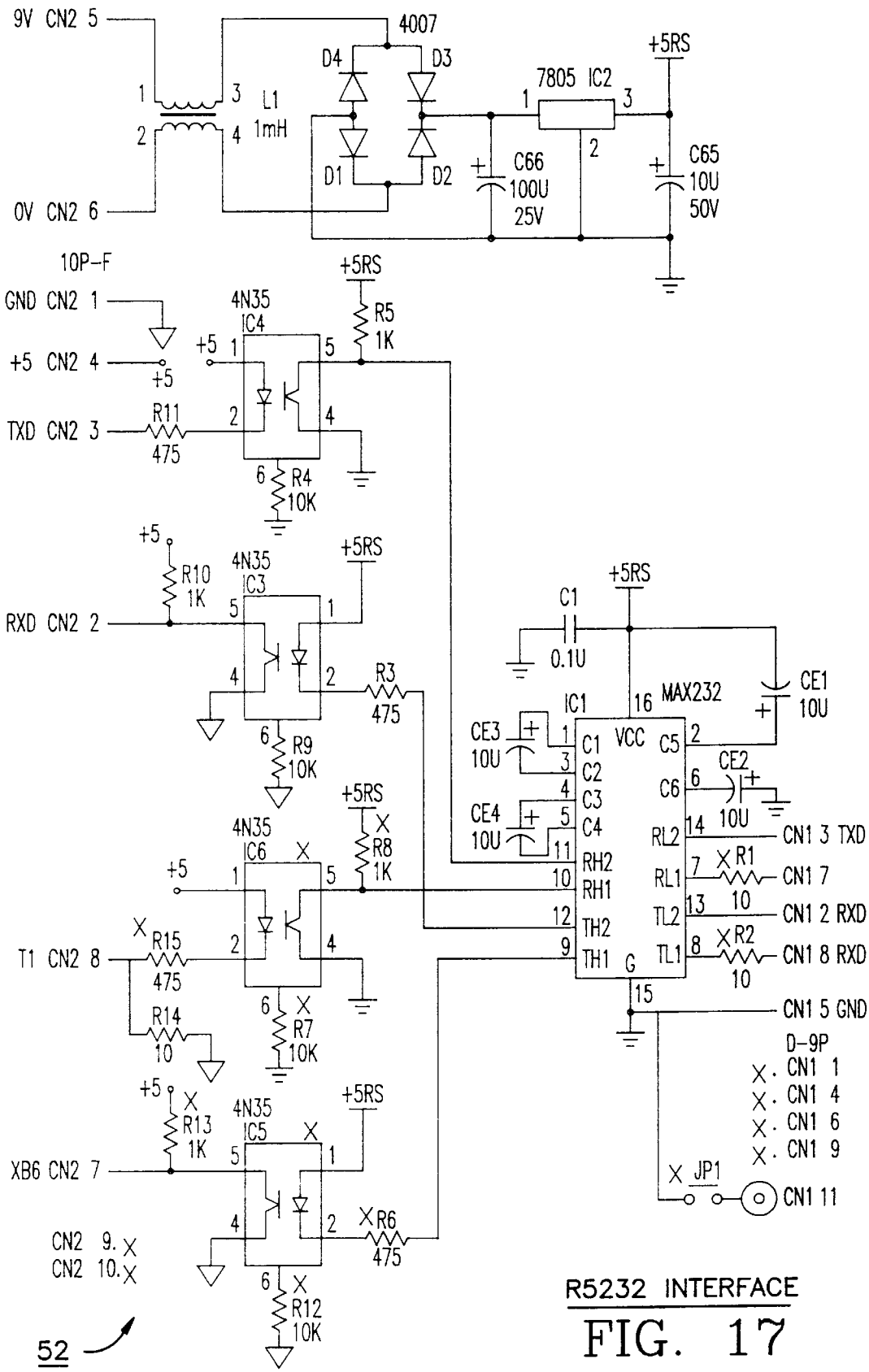
FIG. 17 is a schematic circuit diagram showing an RS-232 interface which may be used as an alternatively to the GPIB interface shown in FIG. 16.

In addition to the D-sub connector based remote input and output interface circuits discussed above and shown in FIGS. 12D and 12E, the main controller can be connected to either an GPIB interface board or an RS-232 interface board. The boards themselves, illustrated in FIGS. 16 and 17, are not part of the present invention and the circuit diagrams thereof are included for completeness rather for purposes of illustrating the invention.

Basically, the GPIB or RS-232 interfaces permit a remote computer to carry out all set-up and test functions that would otherwise be carried out manually via the buttons on the front panel 1 of the instrument, and to receive data that is normally displayed on the LCD display 2 and the various indicators.

Having thus described a preferred embodiment of the invention in sufficient detail to enable those skilled in the art to make and use the invention, it will nevertheless be appreciated that numerous variations and modifications of the illustrated embodiment may be made without departing from the spirit of the invention. For example, while the illustrated embodiment is arranged to carry out a ground bond test, those skilled in the art will appreciate that the ground bond test could be replaced by a lower current ground impedance or continuity test. In addition, such features as the ramp high and charge low features are optional, and may be omitted or replaced without departing from the scope of the invention, and the keypad could be replaced by some other type of data entry device. Because of the possibility of the foregoing changes, as well as numerous others which may occur to those skilled in the art, it is intended that the invention not be limited by the above description or accompanying drawings, but that it be defined solely in accordance with the appended claims.

I claim:

1. A safety compliance test instrument, comprising:
a high voltage DC hipot test circuit arranged to output an adjustable DC voltage having a maximum amplitude of at least 1000 volts and of measuring leakage current to ground in a device to which the high voltage is applied in order to perform a hipot test;
a high voltage AC hipot test circuit arranged to output an adjustable AC voltage having a maximum amplitude of at least 1000 volts and of measuring leakage current to ground in the device to which the high voltage is applied;

an insulation resistance test circuit arranged to output a DC voltage of between 100 and 1000 volts and apply it to a device in order to perform an insulation resistance test on the device and display an equivalent resistance of the device; and a current supply circuit arranged to output a low voltage AC current in order to perform tests of a ground circuit of the device, wherein the DC hipot, AC hipot, insulation resistance, and current supply circuits share a common power supply, control circuit, and user interface and wherein the common power circuit for the instrument includes:

a potential transformer arranged to convert input line power to a low voltage sinusoidal waveform;

a rectifier arranged to convert the low voltage sinusoidal waveform output by the potential transformer into a low voltage DC signal;

a multistage amplifier arranged to be controlled by the control circuit to convert the low voltage DC signal into a low voltage, high current output signal;

a voltage amplifying transformer arranged to convert the low voltage, high current signal output by the multistage amplifier into a high voltage AC output for use in an AC hipot test; and a high voltage rectifying circuit arranged to convert the high voltage AC output into a DC voltage for use in the DC hipot and insulation resistance tests.

2. An instrument as claimed in claim 1, wherein the current supply circuit is arranged to measure the impedance of the ground circuit to which the low voltage AC current is applied.

3. An instrument as claimed in claim 2, wherein the current supply circuit is a ground bond test circuit arranged to supply a low voltage AC current having an amplitude sufficient to stress the ground circuit to which the current is applied.

4. An instrument as claimed in claim 1, wherein the operator interface includes data entry means for enabling a user to enter test parameters in response to display of menus under the control of the control circuit.

5. An instrument as claimed in claim 4, wherein the data entry means is a keypad.

6. An instrument as claimed in claim 5, wherein the keypad also enables calibration of the instrument based on meter reading that can be input through the keypad.

7. An instrument as claimed in claim 4, wherein the data entry means enables entry of test parameters for the DC and AC hipot tests, the insulation resistance test, and the ground circuit test, including output voltage, high and low current limits, and dwell time.

8. An instrument as claimed in claim 7, wherein the data entry means further enables entry of a ramp time setting for the DC hipot test.

9. An instrument as claimed in claim 1, wherein the control circuit further includes a remote interface arranged to enable pre-programmed test functions to be initiated and monitored from a remote location.

10. An instrument as claimed in claim 1, wherein the control circuit further includes interface means for enabling full programming, data reading, and data recording functions to be carried out by remote computer software in an automated test environment.

11. An instrument as claimed in claim 1, wherein the instrument further includes a plurality of high voltage and current output ports, and a scanner control circuit for supplying high voltages and ground test currents to the output ports according to a predetermined sequence.

12. An instrument as claimed in claim 1, wherein said display is an LCD display.

13. An instrument as claimed in claim 1, wherein the output of the multistage amplifier is arranged to be directly supplied to a current output port of the instrument for use in a ground bond test.

14. An instrument as claimed in claim 1, wherein the high voltage rectifying circuit also includes an impedance network for detecting leakage currents during an AC or DC hipot test, or an insulation resistance test, the impedance network including a plurality of switches operable by the control circuit for varying the impedance of the network.

15. An instrument as claimed in claim 14, wherein the impedance network is connected to detection circuitry for detecting currents present in the impedance network and processing the detected currents for analysis by a microprocessor, said analysis including comparison of the detected currents with predetermined high and low current levels.

16. An instrument as claimed in claim 15, wherein said microprocessor includes means for raising the high limit during a DC hipot ramp procedure in order to prevent the high limit from being triggered by charging currents.

17. An instrument as claimed in claim 15, wherein said microprocessor includes means for setting a low limit during initial application of power to the device and means for indicating that the device has not been properly connected if a detected current does not trigger the low limit.

18. An instrument as claimed in claim 15, wherein said microprocessor includes means for setting an arc detection threshold.

19. An instrument as claimed in claim 1, wherein said control circuit includes a microprocessor.

* * * * *